(12) United States Patent
Maehata

(10) Patent No.: US 9,264,063 B2
(45) Date of Patent: Feb. 16, 2016

(54) METHOD FOR DESIGNING BAND PASS DELTA-SIGMA MODULATOR, BAND PASS DELTA-SIGMA MODULATOR, SIGNAL PROCESSING DEVICE, AND RADIO TRANSCEIVER

(71) Applicant: SUMITOMO ELECTRIC INDUSTRIES, LTD., Osaka-shi, Osaka (JP)

(72) Inventor: Takashi Maehata, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/217,696

(22) Filed: Mar. 18, 2014

(65) Prior Publication Data

US 2014/0198878 A1    Jul. 17, 2014

Related U.S. Application Data

(63) Continuation of application No. PCT/JP2012/075759, filed on Oct. 4, 2012.

(30) Foreign Application Priority Data

Oct. 4, 2011    (JP) ................................. 2011-220406
Sep. 24, 2012    (JP) ................................. 2012-209370

(51) Int. Cl.
*H04L 25/03*    (2006.01)
*H03M 3/00*    (2006.01)
(Continued)

(52) U.S. Cl.
CPC .............. *H03M 3/30* (2013.01); *G06F 17/5068* (2013.01); *H03M 3/402* (2013.01); *H04L 25/03828* (2013.01); *H04L 25/08* (2013.01)

(58) Field of Classification Search
CPC ... H03M 3/454; H03M 7/3022; H03M 3/458; H03M 3/502; H03M 7/3017; H03M 3/414; H03M 3/422; H03M 3/424; H03M 7/3024; H03M 7/3015; H03M 7/3028; H03M 3/42; H03M 3/426; H03M 3/428; H03M 3/392; H03M 3/30; H04L 27/367; H04B 15/00; H03F 1/324
USPC .................................. 375/295, 296, 219–220
See application file for complete search history.

(56) References Cited

U.S. PATENT DOCUMENTS 6,442,195 B1 *   8/2002   Liu et al. ........................ 375/220
7,504,976 B1 *   3/2009   Pellon ............................ 341/143
(Continued)

FOREIGN PATENT DOCUMENTS

JP    H02-214236       8/1990
JP    H07-214259 A     8/1995
(Continued)

OTHER PUBLICATIONS

Tsai-Pi Hung, et al., "Design of H-Bridge Class-D Power Amplifiers for Digital Pulse Modulation Transmitters," IEEE Transactions on Microwave Theory and Techniques, vol. 55, No. 12, Dec. 2007, pp. 2845-2854.

(Continued)

*Primary Examiner* — Emmanuel Bayard
(74) *Attorney, Agent, or Firm* — Drinker Biddle & Reath LLP

(57) ABSTRACT

To obtain a band pass delta sigma modulator (excluding $\theta_0 - \pm(\pi/2) \times n$; n is an integer being 1 or greater) for a desired frequency by replacing z in a z domain model of a low pass delta-sigma modulator with z' below:

$z' = f_{cnv}(z, \theta_0)$, wherein $f_{cnv}(z, \theta_0)$ is a function in which the absolute value of $f_{cnv}(z, \theta_0)$ is always 1 for any z and $\theta_0$, $\theta_0 = 2\pi \times (f_0/fs)$, fs is a sampling frequency, and $f_0$ is a center frequency of a quantization noise stop band of the band pass delta-sigma modulator.

15 Claims, 21 Drawing Sheets

(51) Int. Cl.
*G06F 17/50* (2006.01)
*H04L 25/08* (2006.01)

(56) References Cited

U.S. PATENT DOCUMENTS

| | | | |
|---|---|---|---|
| 7,561,635 B2* | 7/2009 | Norsworthy et al. | 375/295 |
| 8,354,947 B2* | 1/2013 | Chang et al. | 341/143 |
| 2004/0037363 A1* | 2/2004 | Norsworthy et al. | 375/259 |
| 2005/0265481 A1* | 12/2005 | Bellaouar et al. | 375/308 |
| 2006/0119493 A1* | 6/2006 | Tal et al. | 341/143 |
| 2008/0075194 A1* | 3/2008 | Ravi et al. | 375/297 |
| 2009/0002079 A1* | 1/2009 | Venuti et al. | 331/10 |
| 2009/0253398 A1* | 10/2009 | Sheehy et al. | 455/313 |
| 2011/0006937 A1* | 1/2011 | Zoso | 341/143 |
| 2012/0127009 A1* | 5/2012 | Pagnanelli | 341/143 |

FOREIGN PATENT DOCUMENTS

| | | |
|---|---|---|
| JP | 2004-048703 A | 2/2004 |
| JP | 2004-088431 A | 3/2004 |
| JP | 2005-020698 A | 1/2005 |
| JP | 2005-311472 A | 11/2005 |
| JP | 2009-194432 A | 8/2009 |
| JP | 2010-187298 A | 8/2010 |
| JP | 2011-019164 | 1/2011 |
| JP | 2012-060568 A | 3/2012 |
| WO | WO-03/030373 A1 | 4/2003 |
| WO | WO-2006/103921 A1 | 10/2006 |
| WO | WO 2011/052870 | 5/2011 |
| WO | WO 2011/093621 | 8/2011 |

OTHER PUBLICATIONS

Martin Schmidt, et al., "Continuous-Time Bandpass Delta-Sigma Modulator for a Signal Frequency of 2.2 GHz," German Microwave Conference, Mar. 2009, pp. 1-4.

Motoi Yamaguchi, et al., "The transfer function design of bandpass Delta-Sigma modulators," 2000 Nen The Institute of Electronics, Information and Communication Engineers Sogo Taikai Koen Ronbunshu, Electronics 2, Mar. 7, 2000, p. 137, C-12-42.

Takao Waho, et al., "Understanding Delta-Sigma Data Converters," Aug. 15, 2007, pp. 11, 12, 114-135.

* cited by examiner

FIG. 3
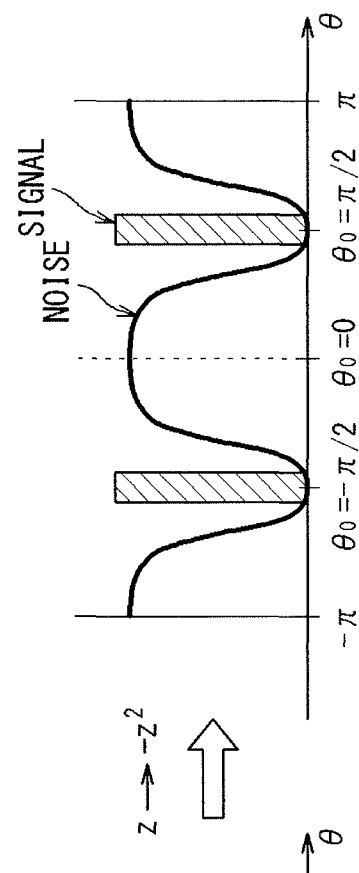
(a)
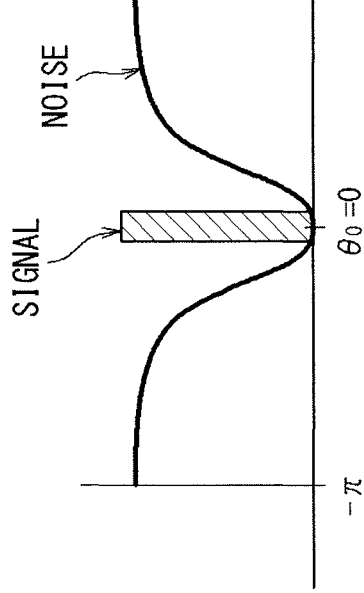
(b)

FIG. 4
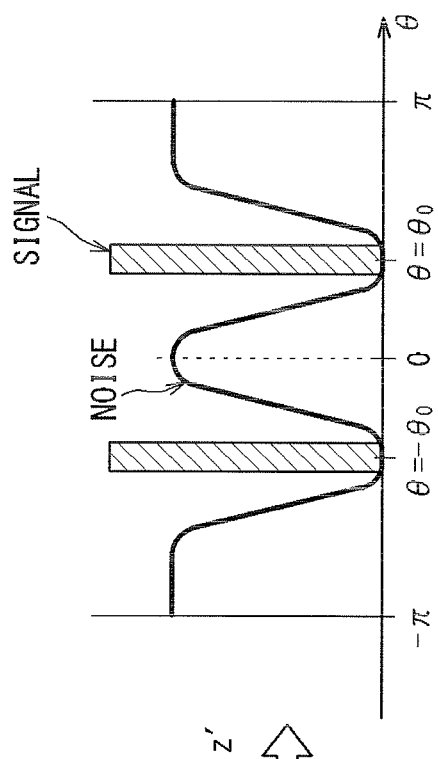
(a)
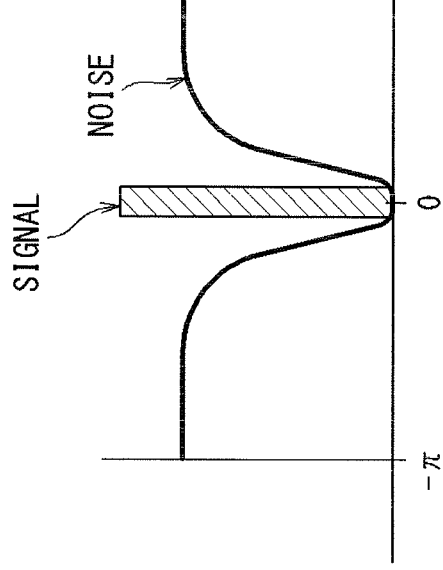
(b)

FIG. 14
(a)
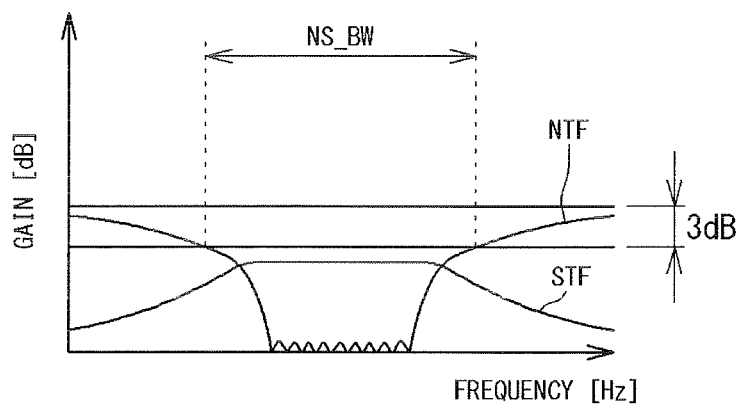
(b)
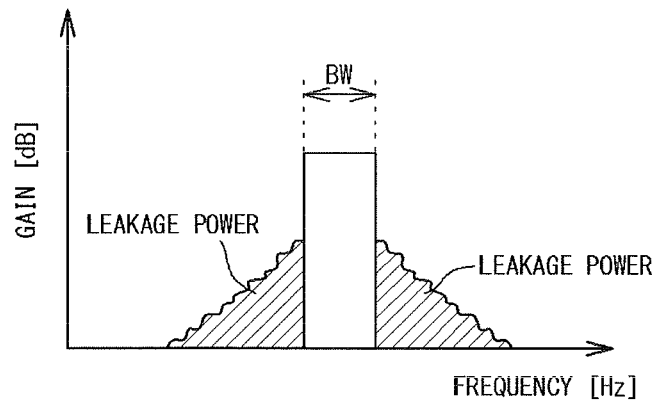

FIG. 21
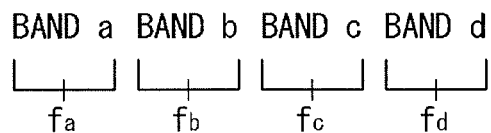
COMMUNICATION BAND
(BAND THAT CAN BE USED
IN COMMUNICATION)
⇓ BAND SELECT
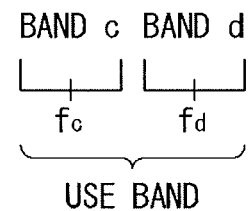

US 9,264,063 B2

METHOD FOR DESIGNING BAND PASS DELTA-SIGMA MODULATOR, BAND PASS DELTA-SIGMA MODULATOR, SIGNAL PROCESSING DEVICE, AND RADIO TRANSCEIVER

TECHNICAL FIELD

The present invention relates to methods for designing band pass delta-sigma modulators, band pass delta-sigma modulators, signal processing devices, and radio transceivers.

BACKGROUND ART

A delta-sigma modulation is a kind of oversampling modulation, and in general, is a technology used in AD conversion or DA conversion (see Non Patent Literature 1).

In delta-sigma modulation, noise shaping for greatly reducing quantization noise in a signal band by moving the quantization noise in the signal band to outside the signal band is performed.

Here, the term "delta-sigma modulation" means low pass delta-sigma modulation in many cases.

In low pass delta-sigma modulation, noise shaping is performed such that quantization noise at low frequencies is moved to higher frequency side, whereby quantization noise at low frequencies is attenuated. That is, in low pass delta-sigma modulation, a noise transfer function has a characteristic of stopping passing noise at low frequencies (near 0 Hz).

As delta-sigma modulation, other than the low pass delta-sigma modulation, there also is band pass delta-sigma modulation in which a noise transfer function stops passing noise at frequencies higher than 0 Hz.

CITATION LIST

Non Patent Literature

NON PATENT LITERATURE 1: Understanding Delta-Sigma Data Converters, Takao Waho and Akira Yasuda (translation supervisors) (Original authors: Richard Schreier, Gabor C. Temes), Maruzen Co., Ltd., 2007

SUMMARY OF INVENTION

Technical Problem

<First Problem>

According to Non Patent Literature 1, by performing conversion of z to $-z^2$ on a z domain model of a low pass delta-sigma modulator, the low pass delta-sigma modulator can be converted into a band pass delta-sigma modulator.

However, even when a conversion formula from z to $-z^2$ is used, only a fs/4 band pass delta-sigma modulator which operates at a frequency being ¼ of the sampling frequency fs (a band pass delta-sigma modulator in which the center frequency $f_0$ of the quantization noise stop band is fs/4) is obtained.

That is, a band pass delta-sigma modulator obtained by using the conversion formula from z to $-z^2$ is limited to a band pass delta-sigma modulator in which the center frequency $f_0$ of the band of the signal to be processed is a frequency being ¼ of the sampling frequency fs.

Non Patent Literature 1 discloses no configuration for a band pass delta-sigma modulator for a frequency $f_0$ other than the frequency being ¼ of the sampling frequency fs. Naturally, Non Patent Literature 1 does not disclose at all how to design a band pass delta-sigma modulator for any frequency $f_0$ other than ¼ of the sampling frequency fs.

Therefore, a problem to be solved (first problem) from a certain point of view is to obtain a band pass delta-sigma modulator for a desired frequency $f_0$.

<Second Problem>

In delta-sigma modulation, an oversampling ratio (OSR) is defined as follows:

$$OSR = fs/(2 \times BW)$$

fs: a sampling frequency
BW: a signal frequency band

Therefore, when the frequency band BW of the signal to be processed and a desired oversampling ratio (for example, OSR=50) are determined, the sampling frequency fs of the delta-sigma modulation can be determined.

Here, the present inventor has conceived an idea that band pass delta-sigma modulation is to be performed on an RF signal to be transmitted as a radio wave. Performing band pass delta-sigma modulation on the RF signal to be transmitted as a radio wave facilitates handling of the RF signal as a digital signal.

Also in a case where band pass delta-sigma modulation is performed on the RF signal, if the frequency band fs of the RF signal and the oversampling ratio are determined, the sampling frequency BW can be determined.

Here, if the sampling frequency fs is increased, costs of the delta-sigma modulator and accompanying circuits are increased. For example, in mobile communication, there are cases where the bandwidth of a signal is several MHz to several tens of MHz. Therefore, it is desired to suppress the sampling frequency fs at a level as low as possible.

In order to suppress the sampling frequency fs at a low level, it is sufficient that the sampling frequency fs=OSR×(2×BW). However, the present inventor has found that, when the sampling frequency fs of delta-sigma modulation is suppressed at a low level, leakage power leaking to outside the signal band becomes a problem.

That is, in a radio wave, there are cases where leakage power leaking to outside the signal band becomes a problem. Thus, the magnitude of leakage power outside the signal band is often regulated by legal regulations or communications standards. This is because if leakage power to outside the signal band is increased, the leakage power may interfere with adjacent channels.

On the other hand, in delta-sigma modulation, quantization noise in the signal band is moved to outside the signal band, and thus, power due to quantization noise tends to be relatively large also outside the signal band.

Therefore, when delta-sigma modulation is performed on the RF signal, there is a risk that quantization noise outside the signal band increases leakage power.

Thus, a problem to be solved (second problem) from another point of view is to suppress quantization noise from causing increase of leakage power when band pass delta-sigma modulation is performed on an RF signal to be transmitted as a radio wave.

Solution to Problem

<Solution to the First Problem>

With respect to the first problem, the present invention from one point of view is a method for designing a band pass delta-sigma modulator, the method including: obtaining a band pass delta-sigma modulator (excluding $\theta_0 = \pm(\pi/2) \times n$; n is an integer being 1 or greater), by replacing z in a z domain model of a low pass delta-sigma modulator with z' below:

$$z' = f_{cnv}(z, \theta_0), \text{ wherein}$$

$f_{cnv}(z, \theta_0)$ is a function in which an absolute value of $f_{cnv}(z, \theta_0)$ is always 1 for any z and $\theta_0$, $$\theta_0 = 2\pi \times (f_0/fs),$$

fs is a sampling frequency, and $f_0$ is a center frequency of a quantization noise stop band of the band pass delta-sigma modulator.

According to the method for designing the band pass delta-sigma modulator above, a band pass delta-sigma modulator for a desired frequency $f_0$ can be obtained.

With respect to the first problem, the present invention from another point of view is a band pass delta-sigma modulator (excluding $\theta_0 = \pm \pi/2 \times n$; n is an integer being 1 or greater) obtained by replacing z in a z domain model of a low pass delta-sigma modulator with z' below:

$$z' = f_{cnv}(z, \theta_0), \text{ wherein}$$

$f_{cnv}(z, \theta_0)$ is a function in which an absolute value of $f_{cnv}(z, \theta_0)$ is always 1 for any z and $\theta_0$, $$\theta_0 = 2\pi \times (f_0/fs),$$

fs is a sampling frequency, and $f_0$ is a center frequency of a quantization noise stop band of the band pass delta-sigma modulator.

<Solution to the Second Problem>

With respect to the second problem, the present invention from one point of view is a signal processing device which performs processing on an RF signal to be transmitted as a radio wave, the signal processing device including: a band pass delta-sigma modulator which performs band pass delta-sigma modulation on the RF signal, wherein a quantization noise stop band of the band pass delta-sigma modulator includes a use band of the RF signal and has a bandwidth wider than the use band of the RF signal.

According to the present invention above, even when band pass delta-sigma modulation is performed on an RF signal to be transmitted as a radio wave, the quantization noise stop band has a bandwidth wider than the use band of the RF signal. Thus, in the vicinity of the use band of the RF signal, quantization noise is reduced, and it is possible to suppress the quantization noise from causing increase of leakage power.

BRIEF DESCRIPTION OF DRAWINGS

FIG. 3A is an output spectrum of a low pass delta-sigma modulator.

FIG. 3B is an output spectrum of a band pass delta-sigma modulator.

FIG. 4A is an output spectrum of a low pass delta-sigma modulator.

FIG. 4B is an output spectrum of a band pass delta-sigma modulator.

FIG. 14A shows characteristics of a noise transfer function and a signal transfer function of a band pass delta-sigma modulator.

FIG. 14B is an output spectrum showing leakage power of an RF signal.

FIG. 21 shows a selection example of communication bands.

DESCRIPTION OF EMBODIMENTS

Hereinafter, preferred embodiments of the present invention will be described with reference to the drawings.

[Chapter 1 Design of Band Pass Delta-Sigma Modulator]

[1.0 Outline]

(1) In a method for designing a band pass delta-sigma modulator according to an embodiment, a band pass delta-sigma modulator (excluding $\theta_0 = \pm(\pi/2) \times n$; n is an integer being 1 or greater) is obtained by replacing z in a z domain model of a low pass delta-sigma modulator with z' below:

$$z' = f_{cnv}(z, \theta_0), \text{ wherein}$$

$f_{cnv}(z, \theta_0)$ is a function in which the absolute value of $f_{cnv}(z, \theta_0)$ is always 1 for any z and $\theta_0$, $$\theta_0 = 2\pi \times (f_0/fs),$$

fs is a sampling frequency, and $f_0$ is a center frequency of a quantization noise stop band of the band pass delta-sigma modulator.

According to the above method for designing the band pass delta-sigma modulator, a band pass delta-sigma modulator for a desired frequency $f_0$ can be obtained.

(2) Preferably, $f_{cnv}(z, \theta_0)$ is a formula on one side in an identity in which the value of the other side is 1 or −1, the identity being obtained by changing the formula below:

$$(z-e^{j\theta_0})(z-e^{-j\theta_0})=0 \qquad [\text{Math. 1}]$$

(3) z' is preferably expressed by the formula below:

$$z' = z\frac{z-\cos\theta_0}{(\cos\theta_0)z-1} \qquad [\text{Math. 2}]$$

(4) z' is preferably expressed by the formula below:

$$z' = -z\frac{z-\cos\theta_0}{(\cos\theta_0)z-1} \qquad [\text{Math. 3}]$$

(5) z' is preferably expressed by the formula below:

$$z' = \frac{(\cos\theta_0)z-1}{z(z-\cos\theta_0)} \qquad [\text{Math. 4}]$$

(6) z' is preferably expressed by the formula below:

$$z' = -\frac{(\cos\theta_0)z-1}{z(z-\cos\theta_0)} \qquad [\text{Math. 5}]$$

(7) An embodiment from another point of view is a band pass delta-sigma modulator (excluding $\theta_0=\pm(\pi/2)\times n$; n is an integer being 1 or greater) obtained by replacing z in a z domain model of a low pass delta-sigma modulator with z' below:

$$z'=f_{cnv}(z,\theta_0), \text{ wherein}$$

$f_{cnv}(z, \theta_0)$ is a function in which the absolute value of $f_{cnv}(z, \theta_0)$ is always 1 for any z and $\theta_0$, $$\theta_0=2\pi\times(f_0/fs),$$

fs is a sampling frequency, and $f_0$ is a center frequency of a quantization noise stop band of the band pass delta-sigma modulator.

[1.1 Delta-sigma Modulator]

Figure 1:
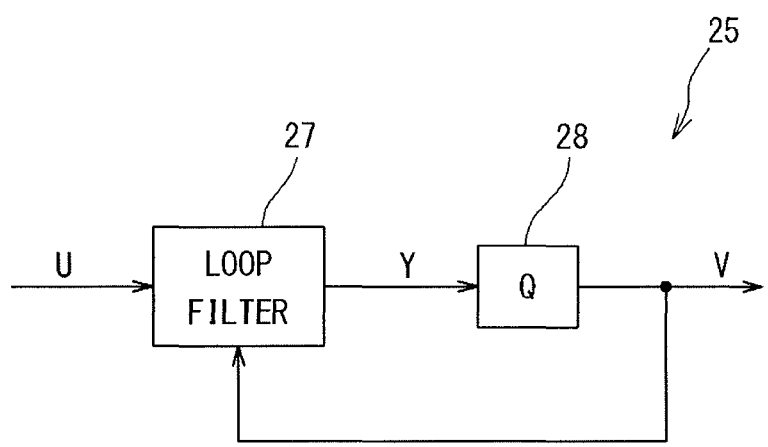
FIG. 1 is a configuration diagram of a delta-sigma modulator.

As shown in FIG. 1, a delta-sigma modulator 25 includes a loop filter 27 and a quantizer 28 (see Non Patent Literature 1).

In the delta-sigma modulator 25 shown in FIG. 1, an input (in the present embodiment, modulated wave) U is provided to the loop filter 27. An output Y from the loop filter 27 is provided to a quantizer (for example, a 1-bit quantizer or a multi-bit quantizer) 28. An output (quantized signal) V from the quantizer 28 is provided to the loop filter 27 as another input.

The characteristic of the delta-sigma modulator 25 can be expressed by a signal transfer function (STF) and a noise transfer function (NTF).

That is, when an input to the delta-sigma modulator 25 is defined as U, an output from the delta-sigma modulator 25 is defined as V, and quantization noise is defined as E, the characteristic of the delta-sigma modulator 25 expressed in the z domain is as follows.

[Math. 6]

$$V(z)=STF(z)U(z)+NTF(z)E(z) \qquad (1)$$

Therefore, when a desired NTF and a desired STF are given, the transfer function of the loop filter 27 can be obtained.

Such delta-sigma modulation is one kind of oversampling modulation, and in general, is a technology used for AD conversion or DA conversion.

In delta-sigma modulation, noise shaping for greatly reducing quantization noise in a signal band by moving the quantization noise in the signal band to outside the signal band is performed.

Figure 2:
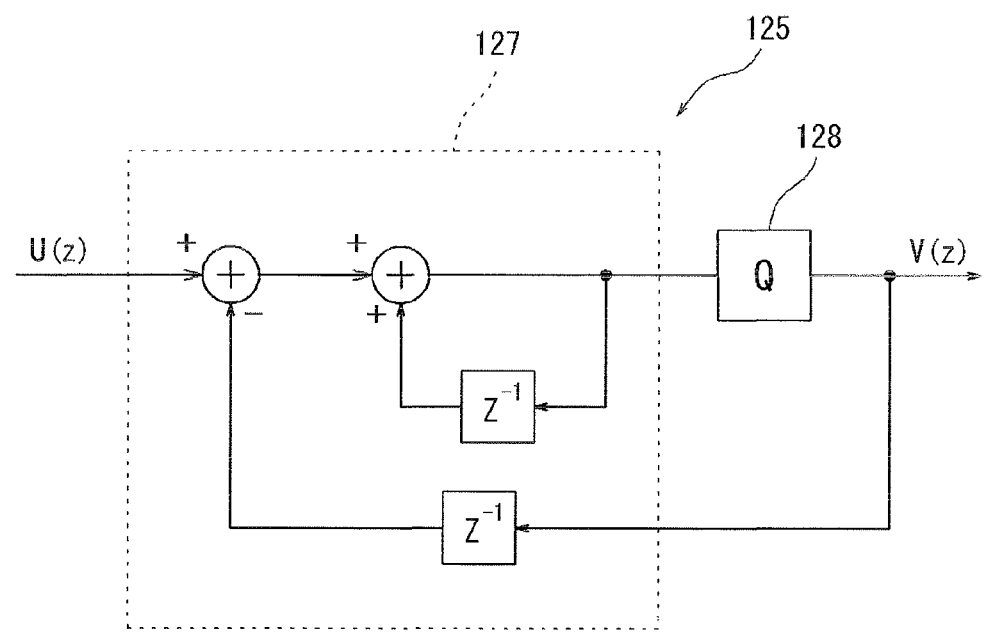
FIG. 2 is a primary low pass delta-sigma modulator.

FIG. 2 shows a block diagram of a linear z domain model of a primary low pass delta-sigma modulator 125. Reference sign 127 represents the part of a loop filter, and reference sign 128 represents a quantizer. When an input to this delta-sigma modulator 125 is defined as U(z), an output therefrom is defined as V(z), and quantization noise is defined as E(z), the characteristic of the delta-sigma modulator 125 expressed in the z domain is as follows.

$$V(z)=U(z)+(1-z^{-1})E(z)$$

That is, in the primary low pass delta-sigma modulator 125 shown in FIG. 2, the signal transfer function STF(z)=1, and the noise transfer function NTF(z)=1−z$^{-1}$.

[1.2 Design of Band Pass Delta-sigma Modulator]
[1.2.1 Conversion Formula]

According to Non Patent Literature 1, by performing the following conversion on a low pass delta-sigma modulator, the low pass delta-sigma modulator can be converted into a band pass delta-sigma modulator.

[Math. 7]

$$z\to-z^2 \qquad (2)$$

In accordance with the above conversion formula, by replacing z in the z domain model of the low pass delta-sigma modulator 125 with $z'=-z^2$, a band pass delta-sigma modulator can be obtained.

When the above conversion formula is used, an nth-order low pass delta-sigma modulator (n is an integer being 1 or greater) can be converted into a 2 nth-order band pass delta-sigma modulator.

For example, the frequency characteristic of the primary low pass delta-sigma modulator 125 is as shown in FIG. 3A. The frequency characteristic of a secondary band pass delta-sigma modulator obtained by converting the primary low pass delta-sigma modulator 125 by using the above conversion formula is as shown in FIG. 3B. In FIG. 3, the horizontal axis θ represents normalized frequency.

Each of the signal transfer function and the noise transfer function of the band pass delta-sigma modulator obtained by using the above conversion formula has the same gain as that of the low pass delta-sigma modulator 125 before the conversion, but with respect to the frequency characteristic shown in FIG. 3B, the frequency characteristic shown in FIG. 3A is compressed into a half and repeated in symmetrical manner.

The band pass delta-sigma modulator obtained by using the above conversion formula has the same stability characteristic and the same SNR characteristic as those of the low pass delta-sigma modulator 125 before the conversion, the low pass delta-sigma modulator 125 operating at the same oversampling ratio as that of the band pass delta-sigma modulator.

However, with the above conversion formula, as shown in FIG. 3B, only a band pass delta-sigma modulator for a frequency being ¼ (normalized frequency θ=±π/2) of a sampling frequency fs can be obtained. That is, with the above conversion formula, only a band pass delta-sigma modulator in which ¼ frequency (normalized frequency θ=±π/2) of the sampling frequency fs is the center frequency $f_0$ of a quantization noise stop band can be obtained.

The present inventor has found a conversion formula for obtaining, from a low pass delta-sigma modulator, a band pass delta-sigma modulator that has a desired frequency $f_0$ ($\theta=\theta_0$) as the center frequency $f_0$. This conversion formula is formula (3) below, for example.

[Math. 8]

$$z \to z\frac{z - \cos\theta_0}{(\cos\theta_0)z - 1} \quad (3)$$

wherein $$\theta_0 = 2\pi \times (f_0/fs).$$

The conversion formula (2) relates to a specific frequency $\theta_0 = \pi/2$. In contrast, the conversion formula (3) has been generalized for any frequency ($\theta_0$).

[1.2.2 Concept of Conversion Formula]

With respect to a low pass delta-sigma modulator, on a premise of $z = e^{j\omega T} = 1$, the absolute value of z' for converting a low pass modulator into a band pass delta-sigma modulator while maintaining the characteristic of the low pass modulator should be 1.

This is because, unless |z'|=1, the magnitude (amplitude) of a signal that has passed through the element z would change, and thus, the characteristic would degrade compared with that of the low pass delta-sigma modulator before the conversion.

Note that the magnitude of z' may be 1 or −1. This is because z'=1 and z'=−1 are in a relationship in which their phases are merely reversed, and do not change the magnitude of a signal.

Therefore, it is sufficient that z' for obtaining a band pass delta-sigma modulator while maintaining, without degrading, the characteristic of a low pass delta-sigma modulator is a function $f_{cnv}(z, \theta_0)$ including z and $\theta_0$, in which the absolute value of $f_{cnv}(z, \theta_0)$ is always 1 for any z and $\theta_0$.

If such a function $f_{cnv}(z, \theta_0)$ is found, a band pass delta-sigma modulator for a desired frequency $f_0(\theta_0)$ can be obtained from the low pass delta-sigma modulator.

The present inventor has found such a function $z'=f_{cnv}(z, \theta_0)$ and obtained the conversion formula from z to z' (formula (3)) by generalizing formula (2).

First, conversion from a low pass delta-sigma modulator to a band pass delta-sigma modulator having a desired frequency $f_0$ ($\theta=\theta_0$) as the center frequency $f_0$ is conversion as shown in FIG. 4 when considered in terms of the frequency characteristic. FIG. 4 is obtained by generalizing the formula shown in FIG. 3 for any frequency $f_0(\theta=\theta_0)$.

As shown in FIG. 4B, the center frequency of the noise stop band of the band pass delta-sigma modulator is $f_0(\theta_0=2\pi \times (f_0/fs))$.

Here, using the following relationship

[Math. 9]

$$z = e^{j\omega T} \quad (4)$$

the formula will be considered in terms of the frequency domain. Note that T is a sampling period.

Further, $\omega T$ in formula (4) is

[Math. 10]

$$\omega T = \theta = 2\pi \frac{f_0}{fs} \quad (5)$$

As shown in FIG. 4A, the low pass delta-sigma modulator is operating at $f_0=0(\theta=0)$. Thus, the present inventor has considered that with respect to formula (4), formula (6) below is established in the low pass delta-sigma modulator.

[Math. 11]

$$z = e^{j\omega T} = e^{j\theta} = e^{j0} \quad (6)$$

That is, as shown in FIG. 4A, it can be considered that the low pass delta-sigma modulator is operating at $e^{j0}$.

From formula (6), formula (7) below is obtained.

[Math. 12]

$$z - e^{j0} = 0 \quad (7)$$

Figure 5:
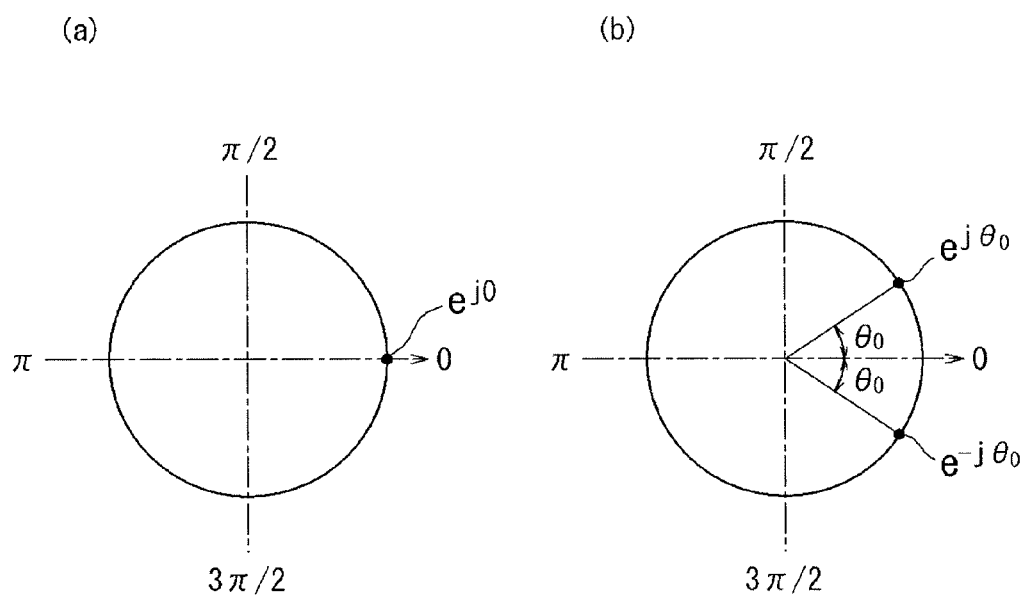
FIG. 5A is polar coordinates showing operation of a low pass delta-sigma modulator.
FIG. 5B is polar coordinates showing operation of a band pass delta-sigma modulator.

On the other hand, as shown in FIG. 4B and FIG. 5B, the band pass delta-sigma modulator operates in a pair of complex conjugates at $\theta_0$ and $-\theta_0$.

Therefore, based on formula (7) in the low pass delta-sigma modulator, and in consideration that the band pass delta-sigma modulator has a pair of complex conjugates, formula (8) below is obtained.

[Math. 13]

$$(z - e^{j\theta_0})(z - e^{-j\theta_0}) = 0 \quad (8)$$

The present inventor has obtained $z'=f_{cnv}(z, \theta_0)$, by using formula (8).

That is, first, by changing the above formula (8) as follows to obtain formula (10) in which the value of the right side (the other side) is 1.

[Math. 14]

$$z^2 - (e^{j\theta_0} + e^{-j\theta_0})z + 1 = 0 \quad (9)$$
$$z^2 - 2(\cos\theta_0)z + 1 = 0$$
$$z^2 - (\cos\theta_0)z - (\cos\theta_0)z + 1 = 0$$
$$z(z - \cos\theta_0) = (\cos\theta_0)z - 1$$

[Math. 15]

$$z\frac{z - \cos\theta_0}{(\cos\theta_0)z - 1} = 1 \quad (10)$$

It is obvious that formula (10) is an identity in which the value of the formula on the left side (one side) always satisfies the value on the left side=1 for any z and $\theta_0$.

Thus, the left side of formula (10) is a function $f_{cnv}(z, \theta_0)$ whose value is always 1 for any z and $\theta_0$.

From formula (10), z' in the conversion formula from z to z' for converting the low pass type into the band pass type is as follows.

[Math. 16]

$$z' = z\frac{z - \cos\theta_0}{(\cos\theta_0)z - 1} \quad (11)$$

From formula (11) above, the conversion formula (3) is obtained.

In formula (3) above, when $\theta_0=\pi/2$ (when $f_0=fs/4$), it is understood that formula (3) is equivalent to the conversion formula (2).

Further, with respect to the low pass delta-sigma converter, $\theta_0=0$. When $\theta_0=0$, the conversion formula (3) becomes a conversion formula from z to z, and it is understood that formula (3) does not convert the low pass delta-sigma converter.

Further, since the value of $z'=f_{cnv}(z, \theta_0)$ may be −1 (since it is sufficient that the absolute value is 1), z' may be in the following form.

[Math. 17]

$$z' = -z\frac{z - \cos\theta_0}{(\cos\theta_0)z - 1} \quad (12)$$

Further, even if the denominator and the numerator of $z'=f_{cnv}(z, \theta_0)$ are switched with each other, the value thereof is 1 or −1. Therefore, z' may be in the following forms.

[Math. 18]

$$z' = \frac{(\cos\theta_0)z - 1}{z(z - \cos\theta_0)} \quad (13)$$

[Math. 19]

$$z' = -\frac{(\cos\theta_0)z - 1}{z(z - \cos\theta_0)} \quad (14)$$

Note that the expression form of the formula $z'=f_{cnv}(z, \theta_0)$ in which the absolute value is always 1 for any z and $\theta_0$ is not limited to those illustrated as a matter of course. The presence of a variety of expression forms of $f_{cnv}(z, \theta_0)$ is obvious also from the fact that there are more than one formula changing manner for obtaining an identity in which the value of the other side is 1 or −1 from formula (8).

[1.3 Example of Band Pass Delta-sigma Modulator]

[1.3.1 First Example]

Figure 6:
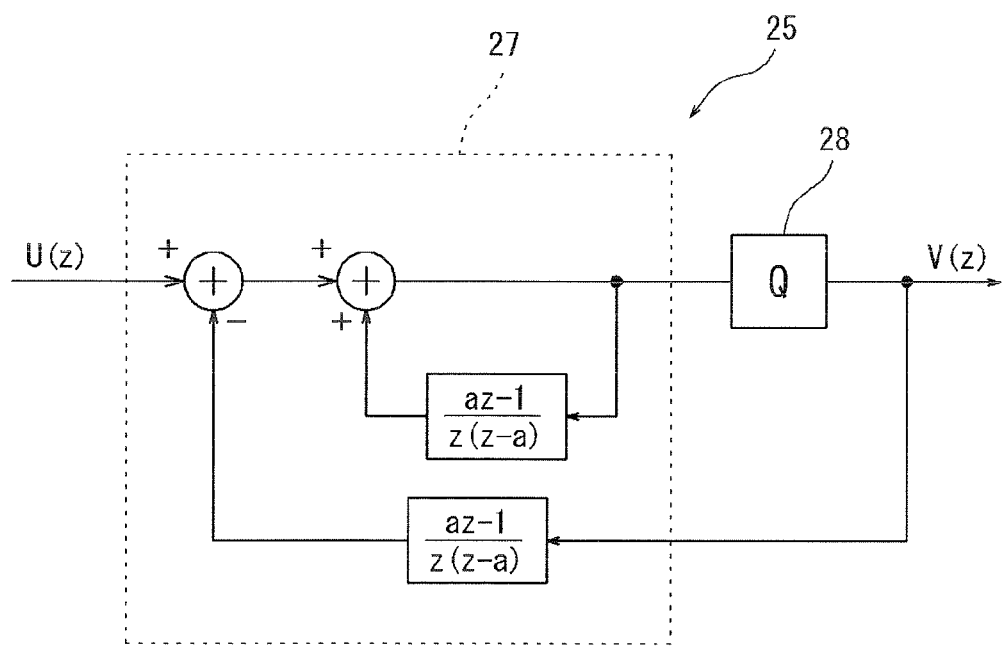
FIG. 6 is a secondary band pass delta-sigma modulator obtained through conversion of the primary low pass delta-sigma modulator.

FIG. 6 shows a secondary band pass delta-sigma modulator 25 obtained by converting the primary low pass delta-sigma modulator 125 shown in FIG. 2, by using the conversion formula (3).

Note that, in the conversion from FIG. 2 to FIG. 6, the following conversion formula which is formula (3) where cos $\theta_0$ is replaced with a is used for convenience for description.

$$z \rightarrow z\frac{z - a}{az - 1} \quad \text{[Math. 20]}$$

[1.3.2 Second Example]

Figure 7:
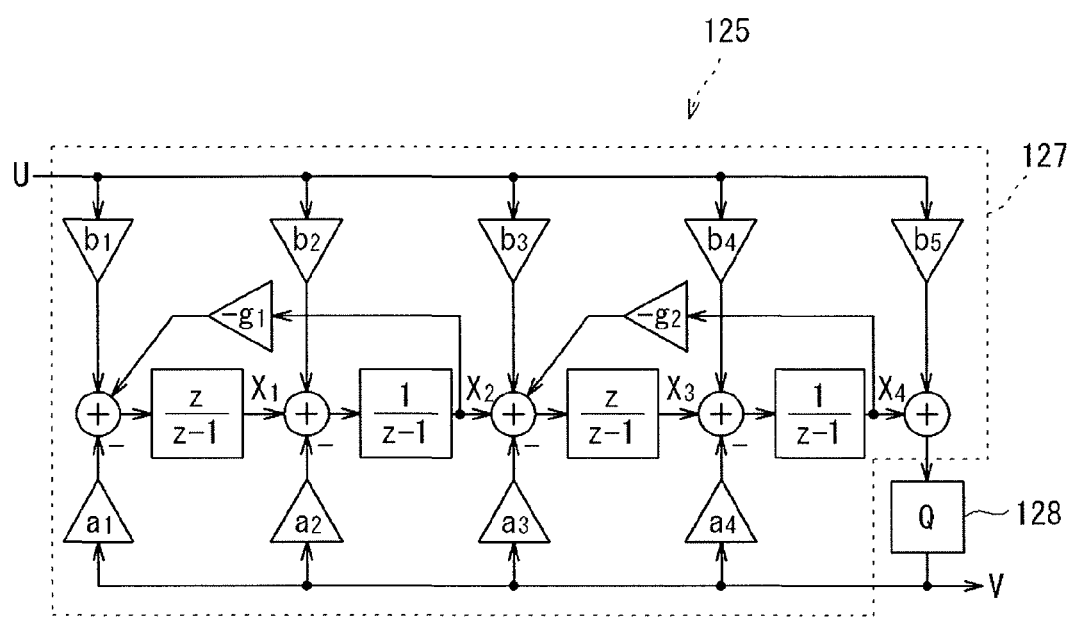
FIG. 7 is a low pass delta-sigma modulator of a CRFB structure.

FIG. 7 shows the low pass delta-sigma modulator 125 including a loop filter 127 of a CRFB structure described in Non Patent Literature 1. In FIG. 7, reference sign 128 represents a quantizer.

Figure 8:
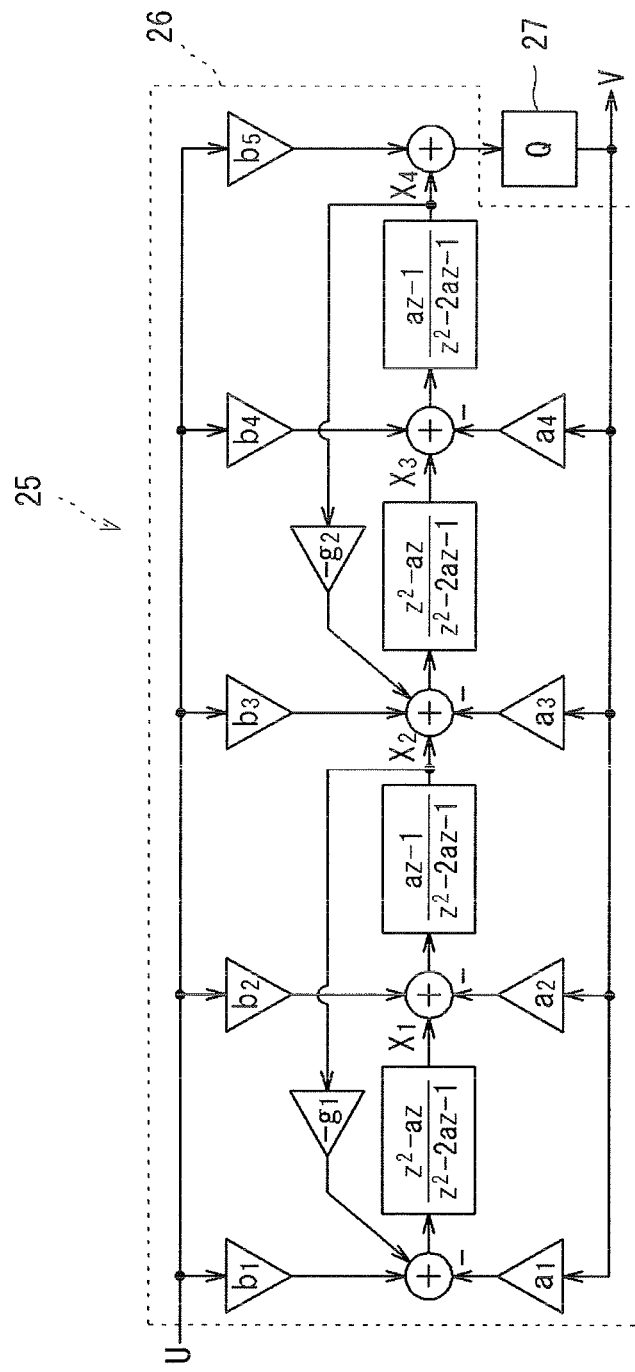
FIG. 8 is a band pass delta-sigma modulator obtained through conversion of the low pass delta-sigma modulator of the CRFB structure.
Figure 9:
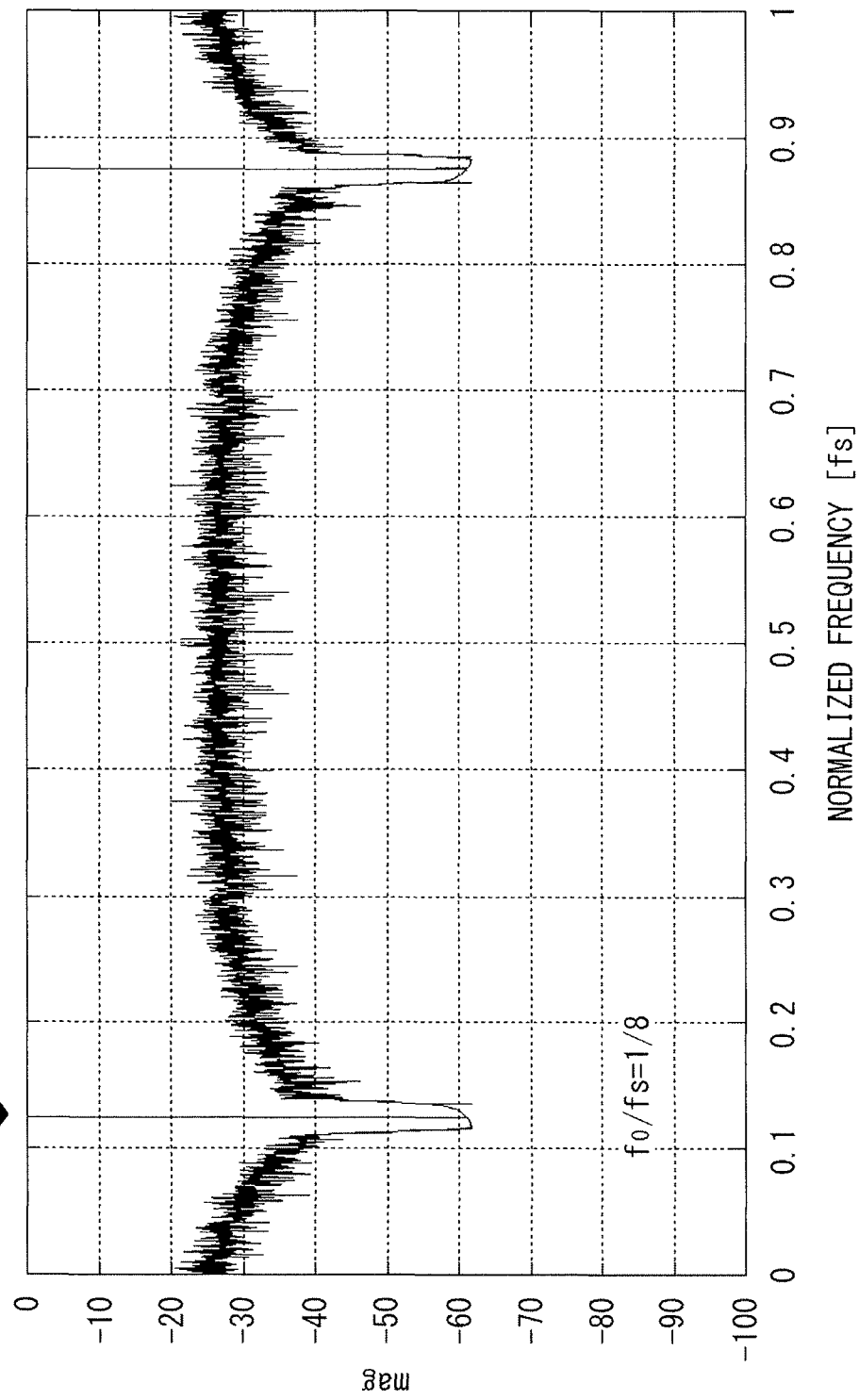
FIG. 9 is an output spectrum wave form chart of a band pass delta-sigma modulator for $\theta_0 = \pi/4$.
Figure 10:
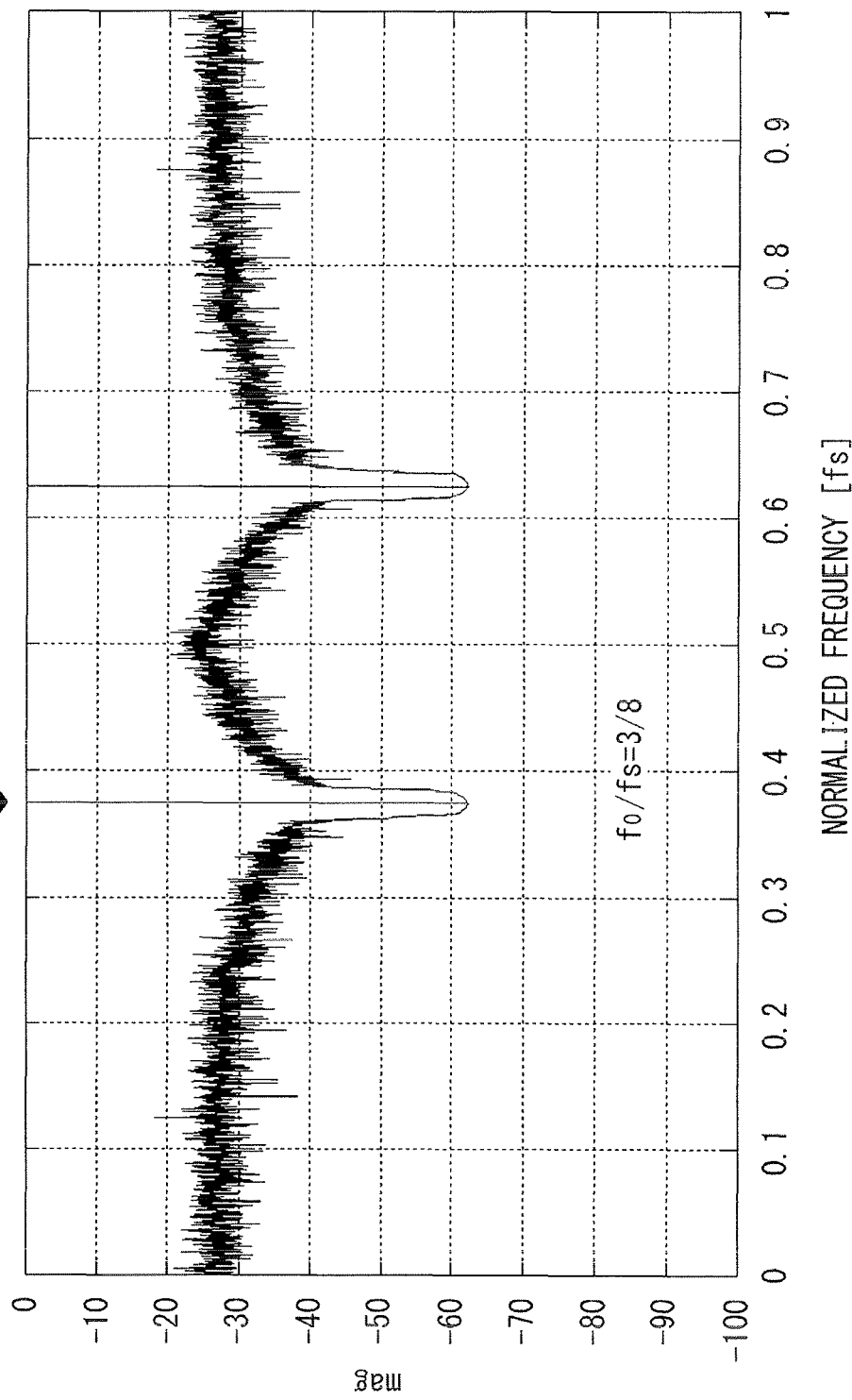
FIG. 10 is an output spectrum wave form chart of a band pass delta-sigma modulator for $\theta_0 = 3\pi/4$.
Figure 11:
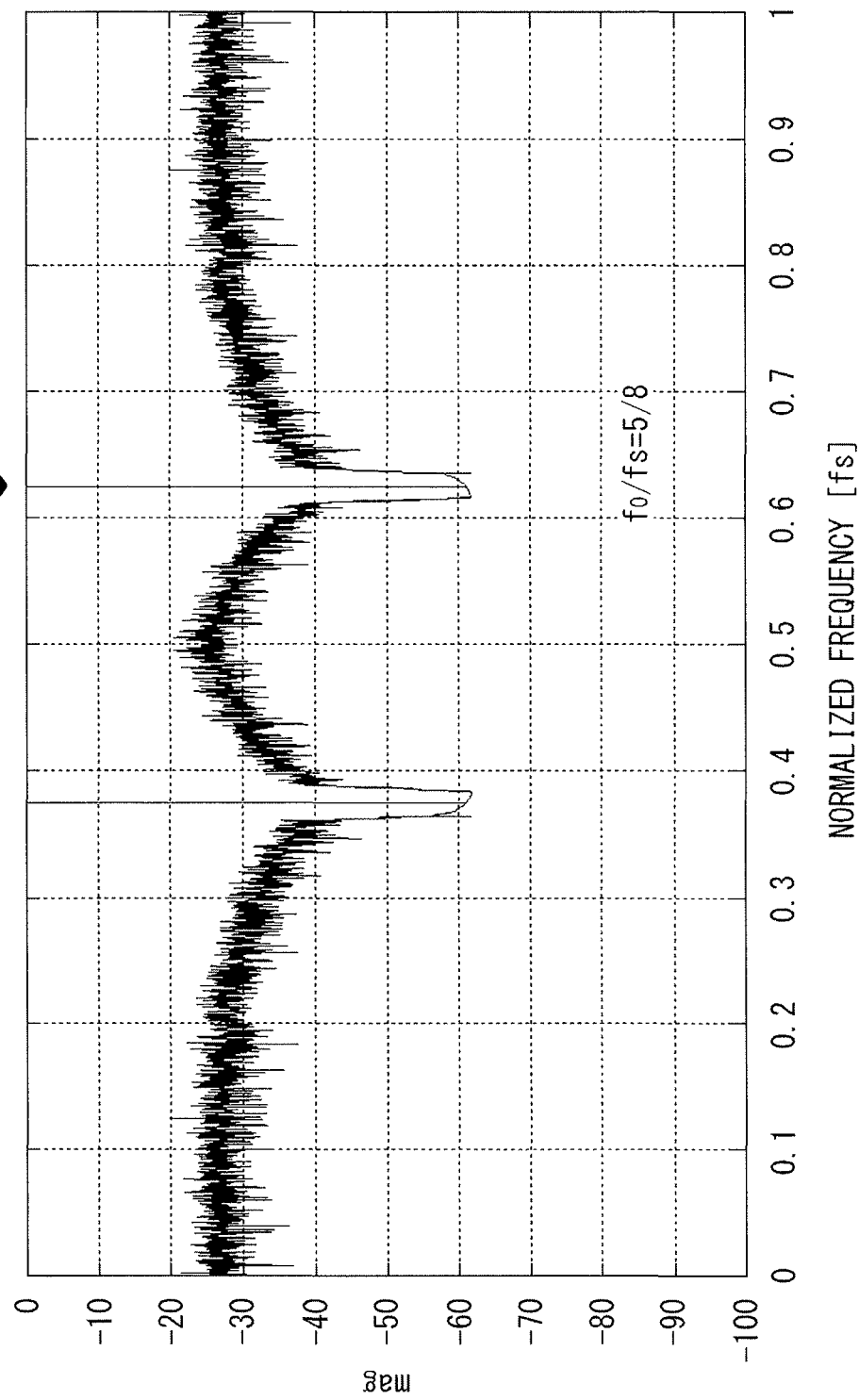
FIG. 11 is an output spectrum wave form chart of a band pass delta-sigma modulator for $\theta_0 = 5\pi/4$.
Figure 12:
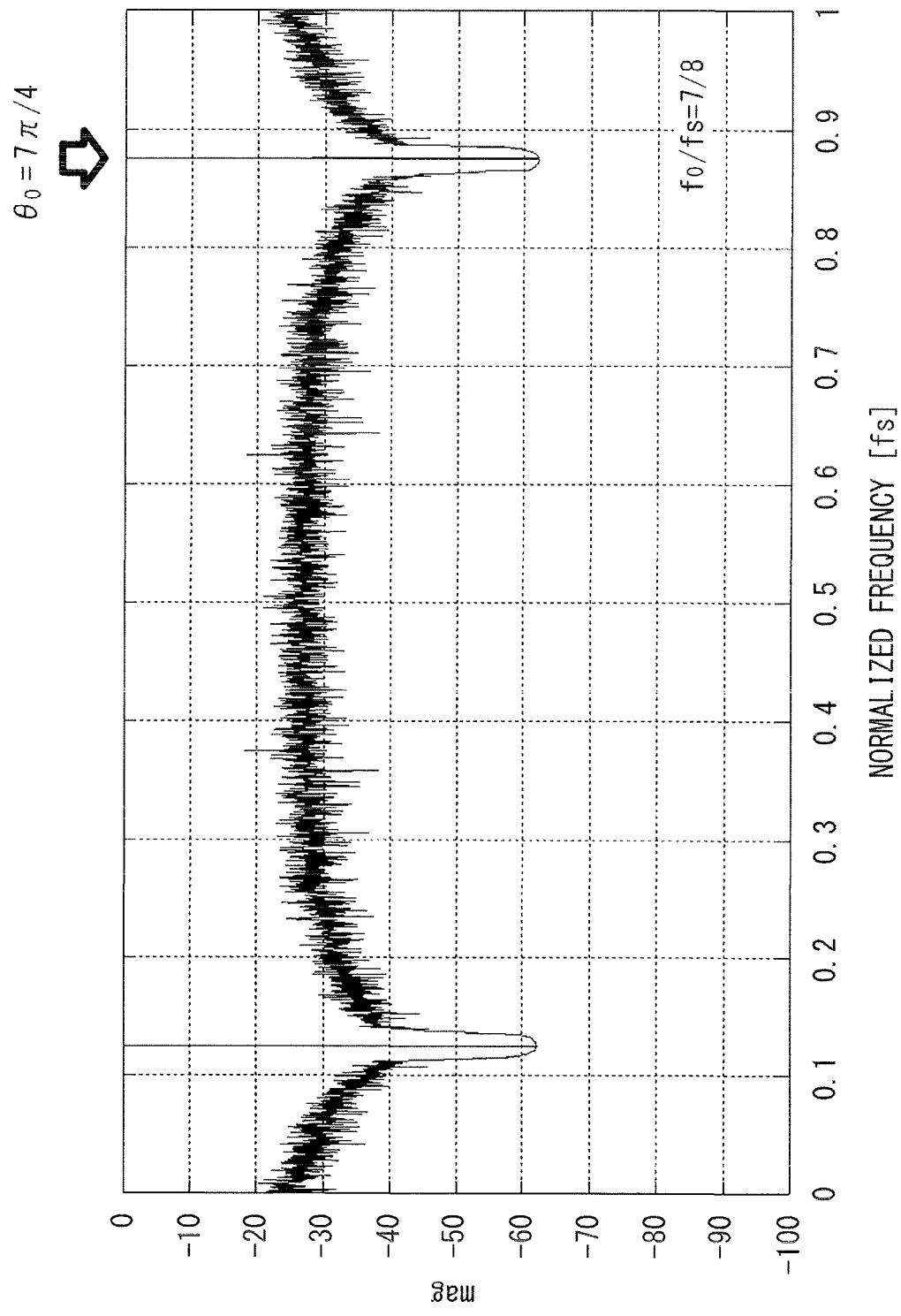
FIG. 12 is an output spectrum wave form chart of a band pass delta-sigma modulator for $\theta_0 = 7\pi/4$.

When the low pass delta-sigma modulator 125 shown in FIG. 7 is converted by using the conversion formula (3), a band pass delta-sigma modulator 25 shown in FIG. 8 is obtained. Also here, in formula (3), cos $\theta_0$ is replaced with a, for convenience of description.

z in (1/(z−1)) and (z/(z−1)) in FIG. 7 is converted by using the conversion formula. The formulae of (1/(z−1)) and (z/(z−1)) after the conversion are as follows, respectively.

$$\frac{1}{z-1} \rightarrow \frac{1}{z\frac{z-a}{az-1} - 1} = \frac{az-1}{z(z-a)-(az-1)} \quad \text{[Math. 21]}$$
$$= \frac{az-1}{z^2 - az - az - 1}$$
$$= \frac{az-1}{z^2 - 2az - 1}$$

$$\frac{z}{z-1} = z\frac{1}{z-1} \rightarrow z\frac{z-a}{az-1}\left(\frac{az-1}{z^2 - 2az - 1}\right) \quad \text{[Math. 22]}$$
$$= \frac{z(z-a)}{z^2 - 2az - 1}$$
$$= \frac{z^2 - az}{z^2 - 2az - 1}$$

[1.3.3 Others]

The conversion into the band pass delta-sigma modulator can also be applied to other higher-order low pass delta-sigma modulators (for example, CIFB structure, CRFF structure, CIFF structure, and the like described in Non Patent Literature 1).

[1.4 Output Result]

FIG. 9 to FIG. 12 show output spectrum waveforms, in the band pass delta-sigma modulator of the second example (FIG. 8), where $\theta_0=\pi/4$ (FIG. 9), where $\theta_0=3\pi/4$ (FIG. 10), where $\theta_0=5\pi/4$ (FIG. 11), and where $\theta_0=7\pi/4$ (FIG. 12), respectively.

As shown in FIG. 9 to FIG. 12, at the respective frequencies $\theta_0=\pi/4$, $3\pi/4$, $5\pi/4$, and $7\pi/4$, signals occur at the respective desired $\theta_0$, and it is understood that a band pass delta-sigma modulator for frequencies other than $\theta_0=\pm\pi/2$ has been obtained.

Conventionally, there has been no established technique for designing a band pass delta-sigma modulator which performs band pass delta-sigma modulation for any frequency $f_0$. However, by using the conversion formulae such as formula (3) and the like, a desired carrier frequency $f_0$ can be set as a noise stop band for a noise transfer function (NTF), and a band pass delta-sigma modulator which performs band pass delta-sigma modulation for the desired carrier frequency $f_0$ can be designed.

[Chapter 2 Suppression of Leakage Power Occurring Due to Quantization Noise]

[2.0 Outline]

(1) A signal processing device according to an embodiment of Chapter 2 is a signal processing device which performs processing on an RF signal to be transmitted as a radio wave, the signal processing device including:

a band pass delta-sigma modulator which performs band pass delta-sigma modulation on the RF signal, wherein a quantization noise stop band of the band pass delta-sigma modulator includes a use band of the RF signal and has a bandwidth wider than the use band of the RF signal.

According to the above embodiment, even when band pass delta-sigma modulation is performed on an RF signal to be transmitted as a radio wave, the quantization noise stop band has a bandwidth wider than the use band of the RF signal. Therefore, in the vicinity of the use band of the RF signal, quantization noise is reduced, and thus, it is possible to suppress the quantization noise from causing increase of leakage power.

(2) Preferably, the use band of the RF signal spans a plurality of communication bands, and the quantization noise stop band has a bandwidth narrower than a minimum bandwidth including adjacent channels and next adjacent channels on both sides of the use band of the RF signal.

In a case where leakage power to adjacent channels and next adjacent channels of the use band of the RF signal is a problem, the quantization noise stop band should be a band wider than a band including the adjacent channels and the next adjacent channels on both sides of the use band of the RF signal.

However, if a plurality of communication bands are considered separately, the quantization noise stop band can be made narrower than a minimum bandwidth including the adjacent channels and the next adjacent channels on both sides of the use band of the RF signal. Accordingly, the sampling rate can be suppressed at a low level.

(3) Preferably, the quantization noise stop band has a bandwidth including, when the plurality of communication bands are regarded as use bands, respectively, all of adjacent channels on both sides of each use band. In this case, the quantization noise can be prevented from becoming leakage power to the adjacent channels.

(4) Preferably, the quantization noise stop band has a bandwidth including, when the plurality of communication bands are regarded as use bands, respectively, all of the adjacent channels and next adjacent channels on both sides of each use band. In this case, the quantization noise can be prevented from becoming leakage power to the adjacent channels and the next adjacent channels.

(5) Preferably, the quantization noise stop band has a bandwidth not wider than a bandwidth in which, when the plurality of communication bands are regarded as use bands, respectively, an additional band having a bandwidth corresponding to one communication band is secured at each of both sides of a minimum basic band including all of the adjacent channels and the next adjacent channels on both sides of each use band. In this case, the quantization noise can be prevented from becoming leakage power to the adjacent channels and the next adjacent channels, and at the same time, the quantization noise stop band does not become too wide, and the sampling rate can be suppressed.

(6) Preferably, the signal processing device further includes: a band selector which selects, from among one or a plurality of communication bands, a use band of the RF signal, and in the signal processing device, the quantization noise stop band has a bandwidth narrower than a minimum band including, when an entirety of the plurality of communication bands is regarded as a use band, adjacent channels and next adjacent channels on both sides of the use band. In this case, the quantization noise stop band does not become too wide, and the sampling rate can be suppressed.

(7) Preferably, the quantization noise stop band has a bandwidth including, when the plurality of communication bands are regarded as use bands, respectively, all of adjacent channels and next adjacent channels on both sides of each use band. In this case, no matter which communication band is selected, the quantization noise can be prevented from becoming leakage power to the adjacent channels and the next adjacent channels.

(8) Preferably, the quantization noise stop band has a bandwidth including adjacent channels on both sides of the use band of the RF signal. In this case, the quantization noise can be prevented from becoming leakage power to the adjacent channels.

(9) Preferably, the quantization noise stop band has a bandwidth including the adjacent channels and the next adjacent channels on both sides of the use band of the RF signal. In this case, the quantization noise can be prevented from becoming leakage power to the adjacent channels and the next adjacent channels.

(10) An embodiment from another point of view is a radio transceiver including the signal processing device according to any one of (1) to (9) above for processing to be performed on the RF signal.

(11) Preferably, the quantization noise stop band in the signal processing device has a bandwidth not narrower than a bandwidth in which a magnitude of leakage power is regulated by legal regulations or standards which require compliance by the radio transceiver.

[2.1 Radio Transceiver]

Figure 13:
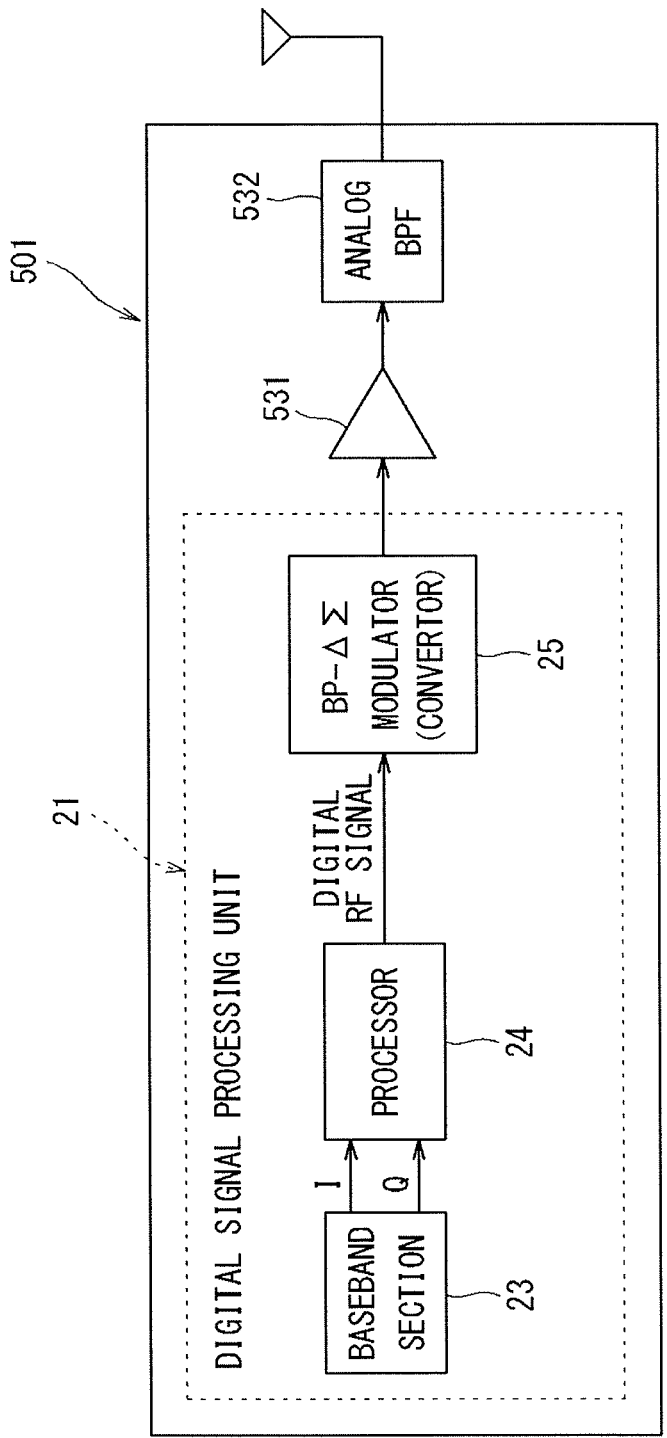
FIG. 13 is a configuration diagram of a radio transceiver including a delta-sigma modulator.

FIG. 13 shows a radio transceiver 501 according to an embodiment of Chapter 2. The radio transceiver 501 includes a digital signal processing unit (signal processing device) 21 including a band pass delta-sigma modulator 25, an amplifier 531, and a band pass filter 532.

The digital signal processing unit 21 outputs a digital signal (quantized signal) representing an RF signal to be sent as a radio wave from an antenna. The RF signal is a signal to be emitted as a radio wave into space, and is, for example, an RF signal for mobile communication, or an RF signal for broadcast service such as television/radio or the like.

The digital signal outputted from the digital signal processing unit 21 is amplified by the amplifier (for example, digital amplifier), to be provided to the analog filter (band pass filter) 532 which removes noise-shaped quantization noise (noise component).

The signal outputted from the analog filter 532 is emitted as a radio wave from the antenna into space.

The digital signal processing unit 21 includes a baseband section 23 which outputs a baseband signal (IQ signals) being information to be transmitted by means of a RF signal, a processor 24 which performs processing such as digital quadrature modulation and the like, and the band pass delta-sigma modulator 25.

The baseband section 23 outputs the IQ baseband signal (each of I signal and Q signal) as digital data.

The processor 24 performs processing, such as digital quadrature modulation and the like, on the IQ baseband signals. Thus, from the processor 24, a signal in a digital signal format expressed in terms of multi-bit digital data (discrete values) is outputted.

Note that the modulation performed in the processor 24 is not limited to quadrature modulation, and may be another type of modulation for generating a modulated wave.

The processor 24 can perform a variety of digital signal processing such as DPD (digital pre-distortion), CFR (crest factor reduction), DUC (digital up conversion), and the like in addition to quadrature modulation. From the processor 24, an RF signal generated through the various kinds of digital signal processing is outputted.

The digital RF signal outputted from the processor 24 is provided to the band pass delta-sigma modulator 25.

The band pass delta-sigma modulator 25 outputs a 1-bit or multi-bit quantized signal, by performing delta-sigma modulation on the RF signal being an input signal.

[2.2 Delta-Sigma Modulation]

The delta-sigma modulator 25 is the same as the delta-sigma modulator 25 described in [Chapter 1 Design of band pass delta-sigma modulator].

[2.3 Delta-Sigma Modulation and Leakage Power]

As shown in FIG. 14A, in the band pass delta-sigma modulator 25, the noise transfer function NTF has a band-stop characteristic. Therefore, the band pass delta-sigma modulator 25 can perform noise shaping for greatly reducing quantization noise in a quantization noise stop band NS_BW, by moving quantization noise to outside the quantization noise stop band NS_BW.

Here, at a desired OSR, in order to suppress the sampling frequency fs at a low level, if the sampling frequency fs is set based on the signal band BW of the RF signal, in accordance with the formula $fs = (2 \times BW) \times OSR$, the noise stop band NS_BW becomes equal to the signal band BW.

On the other hand, in a signal (radio wave) outputted by the radio transceiver, as shown in FIG. 14B, there may be cases where leakage power leaking to outside the signal band BW becomes a problem. Therefore, legal regulations or communications standards regulate the magnitude of leakage power outside a signal band.

For example, in 3GPP TS 36.104 version 9.1.0 Release 9 p 21 "Table 6.6.2.1-2: Base Station ACLR in unpaired spectrum with synchronized operation", it is stipulated that with respect to adjacent channel leakage ratio (ACLR), the ACLR limit in each of the center frequency of an adjacent channel and the center frequency of the next adjacent channel is 45 dB.

When band pass delta-sigma modulation is performed on the RF signal, the output spectrum of the delta-sigma modulator 25 is a spectrum as an RF signal. Therefore, the presence of quantization noise outside the signal band of the RF signal will cause a problem similar to the leakage power to outside the signal band, the leakage power being a problem in a radio wave. That is, if quantization noise is present near the signal band of the RF signal, the quantization noise is superimposed on leakage power.

[2.4 Example of Setting Quantization Noise Stop Band]
[2.4.1 First Example]

In order to prevent quantization noise from becoming leakage power, in the delta-sigma modulator 25 of the present embodiment, the quantization noise stop band NS_BW in the noise transfer function NTF is set to be wider than the bandwidth BW of the use band of the RF signal. Therefore, as shown in FIG. 15, most of the quantization noise is moved to outside the quantization noise stop band (bandwidth NS_BW) which is wider than the bandwidth BW of the RF signal.

Note that the quantization noise stop band NS_BW is a band (3 dB band) where the quantization noise is below the peak value of the quantization noise by 3 dB.

Figure 15:
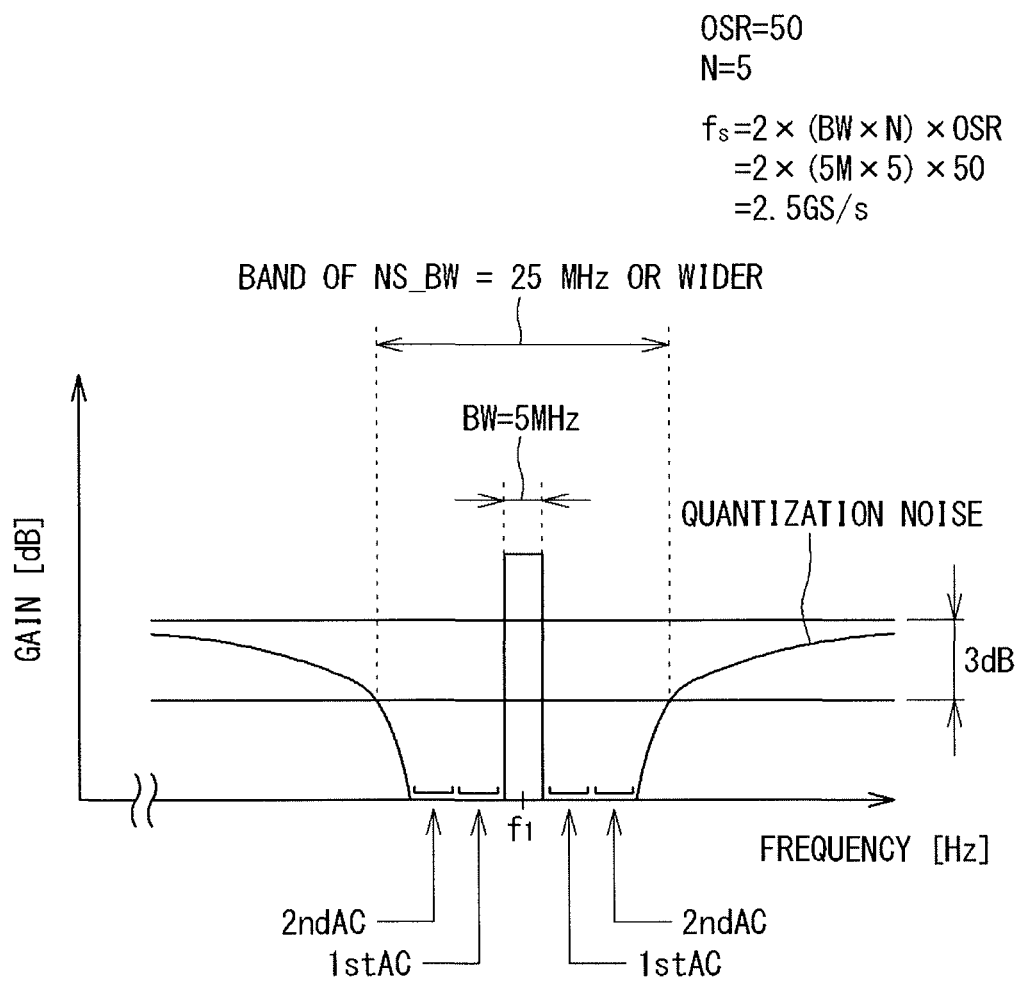
FIG. 15 is an output spectrum of a band pass delta-sigma modulator showing a first example of a quantization noise stop band.

The bandwidth NS_BW of the quantization noise stop band shown in FIG. 15 is extended further outside the use band of the RF signal on both of the high frequency side and the low frequency side of the use band of the RF signal. Therefore, even outside the use band of the RF signal, there is hardly any quantization noise near the use band of the RF signal, and the quantization noise is suppressed from becoming leakage power outside the RF signal band.

Here, in the first example shown in FIG. 15, it is assumed that OSR=50, the bandwidth BW of the RF signal=5 [MHz], and the center frequency of the RF signal is $f_1$. Further, in the first example and other examples, the frequency range in which the magnitude of leakage power is regulated by legal regulations or communications standards which require compliance by the radio transceiver 501 emitting the RF signal is assumed to be adjacent channels (first adjacent channels: 1st ACs) and next adjacent channels (second adjacent channels: 2nd ACs).

The adjacent channels (1st ACs) refer to bands respectively adjacent to both sides of the use band (bandwidth BW) of an RF signal, each adjacent channel having the same bandwidth as the bandwidth BW of the RF signal. Therefore, the minimum bandwidth including the use band of the RF signal and the adjacent channels on both sides thereof (1st ACs) is BW×3 (=15 MHz).

Further, the next adjacent channels (2nd ACs) refer to bands respectively located outside the two adjacent channels, each next adjacent channel having the same bandwidth as the bandwidth BW of the RF signal. Therefore, the minimum bandwidth including the use band of the RF signal, and the adjacent channels (1st ACs) and the next adjacent channels (2nd ACs) is BW×5 (=25 MHz).

The frequency range in which the magnitude of leakage power is regulated by legal regulations or communications standards which require compliance by the radio transceiver 501 emitting the RF signal includes the adjacent channels (first adjacent channels: 1st ACs) and the next adjacent channels (second adjacent channels: 2nd ACs). Corresponding to this, in FIG. 15, the bandwidth NS_BW of the quantization noise stop band is set to be not narrower than the minimum bandwidth (BW×N=5 MHz×5=25 MHz) which includes up to the next adjacent channels (2nd ACs) on both sides of the RF signal.

Here, N is a multiplying factor of the bandwidth NS_BW of the quantization noise stop band relative to the bandwidth BW of the RF signal. When N=5, it means that the quantization noise stop band has a bandwidth five times as wide as the bandwidth BW of the RF signal.

In the first example, preferably, the bandwidth NS_BW of the quantization noise stop band is (BW×N)=5 MHz×7=35 MHz or narrower. If the bandwidth NS_BW of the quantization noise stop band is increased, the sampling frequency is increased. Therefore, by suppressing the bandwidth NS_BW to (BW×7) or narrower, increase of the sampling frequency can be prevented.

As shown in FIG. 15, when the sampling frequency (sampling rate) fs is determined based on the bandwidth (25 MHz) including the adjacent channels and the next adjacent channels, not based on the bandwidth of the use band of the RF signal BW=5 MHz, fs=2×(BW×5)×OSR=2.5 [GS/s] (N=5).

Further, when the sampling frequency (sampling rate) fs is determined based on 35 MHz in the case of N=7, fs=2×(BW×7)×OSR=3.5 [GS/s].

In the RF signal shown in FIG. 15, when the frequency range in which the magnitude of leakage power is regulated by legal regulations or communications standards which require compliance by the radio transceiver 501 emitting the RF signal includes only the adjacent channels (first adjacent channels: 1st ACs), the bandwidth NS_BW of the quantization noise stop band is preferably (BW×N)=5 MHz×3=15 MHz or wider. In this case, more preferably, the bandwidth NS_BW of the quantization noise stop band is (BW×N)=5 MHz×5=25 MHz or narrower.

[2.4.2 Second Example]

In mobile communication and the like, there are cases where multi carriers are used. Specifically, a plurality of communication bands (bandwidth SBW) are prepared as communication bands that can be used by radio transceivers, and in accordance with increase/decrease of the number of user radio transceivers (mobiles), the number of communication bands to be used may be increased/decreased.

Figure 16:
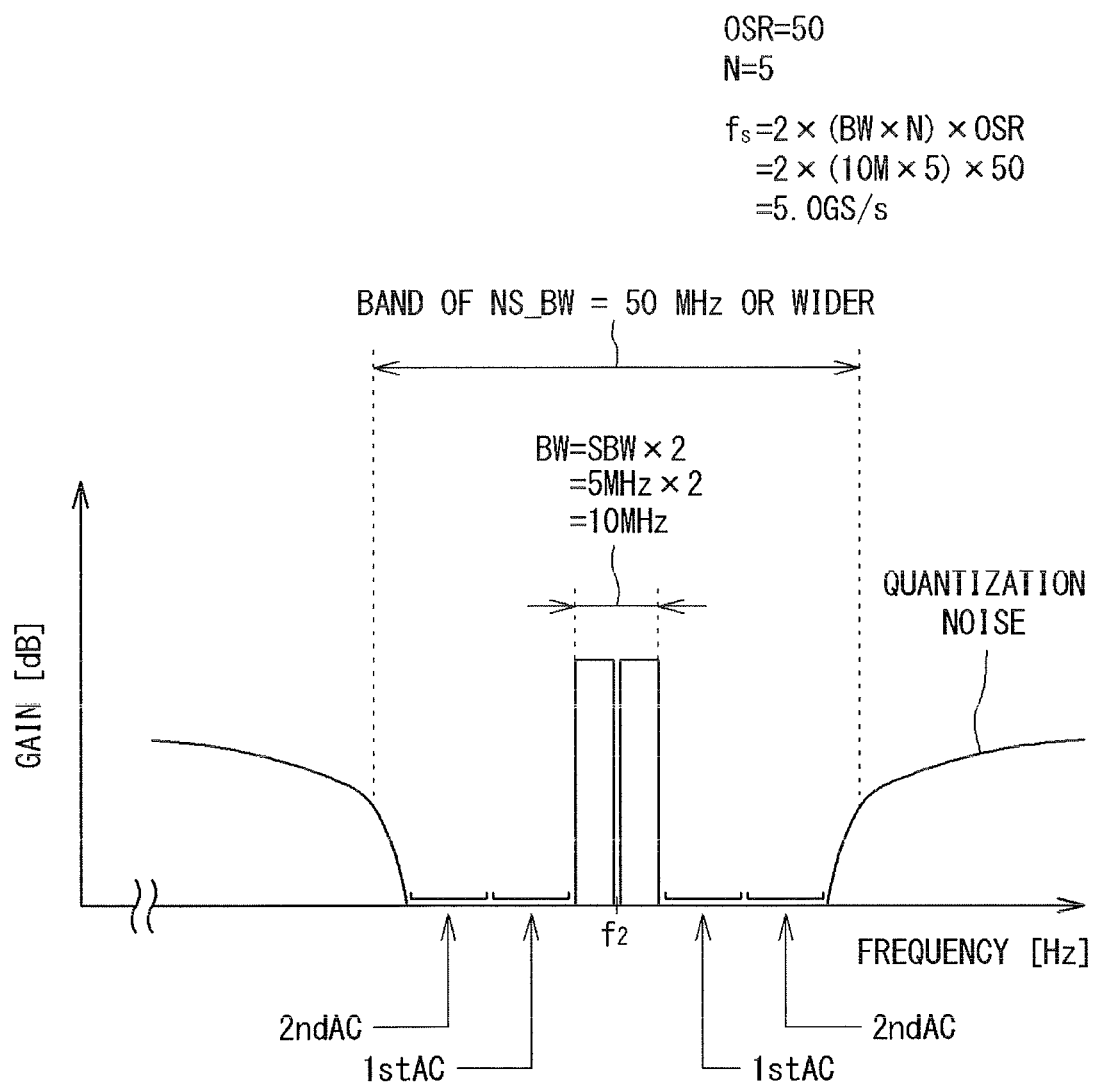
FIG. 16 is an output spectrum of a band pass delta-sigma modulator showing a second example of a quantization noise stop band.

FIG. 16 shows an example in which two (a plurality of) 5 MHz communication bands (SBW=5 MHz) are used in combination to realize a total bandwidth BW of 10 MHz to be used as the signal band of the RF signal. In this case, the use band (BW=10 MHz) of the RF signal spans two (a plurality of) communication bands (SBW=5 MHz).

As shown in FIG. 16, when the bandwidth BW of the use band of the RF signal becomes 10 MHz, the bandwidth of each adjacent channel (1st AC) and each next adjacent channel (2nd AC) also becomes 10 MHz.

Therefore, if the quantization noise stop band is to include the next adjacent channels (2nd ACs) on both sides of the RF signal, it is sufficient that the bandwidth NS_BW of the quantization noise stop band is (BW×N)=10 MHz×5=50 MHz or wider.

Also in the case of the second example shown in FIG. 16, in order to suppress increase of the sampling frequency, it is preferable that the bandwidth NS_BW of the quantization noise stop band is (BW×N)=10 MHz×7=70 MHz or narrower.

In FIG. 16, when the sampling frequency (sampling rate) fs is determined based on the bandwidth (50 MHz) including the adjacent channels and the next adjacent channels, fs=2×(BW×5)×OSR=5.0 [GS/s] (N=5).

Further, when the sampling frequency (sampling rate) fs is determined based on 70 MHz in the case of N=7, fs=2×(BW×7)×OSR=7.0 [GS/s].

In the RF signal shown in FIG. 16, when the frequency range in which the magnitude of leakage power is regulated by legal regulations or communications standards which require compliance by the radio transceiver 501 emitting the RF signal includes only the adjacent channels (first adjacent channels: 1st ACs), the bandwidth NS_BW of the quantization noise stop band is preferably (BW×N)=10 MHz×3=30 MHz or wider. In this case, more preferably, the bandwidth NS_BW of the quantization noise stop band is (BW×N)=10 MHz×5=50 MHz or narrower.

[2.4.3 Third Example]

In the first example and the second example, the bandwidth NS_BW of the quantization noise stop band set to be five times or more of the bandwidth BW of the RF signal has been shown. In contrast, in the third example, the bandwidth NS_BW of the quantization noise stop band set to be less than five times of the bandwidth BW of the RF signal will be shown.

The bandwidth NS_BW of the quantization noise stop band according to the third example has a bandwidth narrower than the minimum bandwidth (BW×5) including the adjacent channels (1st ACs) and the next adjacent channels (2nd ACs) on both sides of the use band of the RF signal.

Also in the third example, the bandwidth NS_BW of the quantization noise stop band is wider than the bandwidth BW of the use band of the RF signal.

As shown in FIG. 17A, in the third example, as in the case of the second example, two 5 MHz communication bands (SWB—5 MHz) c and d are used in combination to realize a total bandwidth BW of 10 MHz to be used as the signal band of the RF signal. That is, the use band (BW=10 MHz) of the RF signal spans two (a plurality of) communication bands (SBW=5 MHz).

In the second example described above, since the bandwidth BW of the RF signal is twice of that in the first example, the bandwidth NS_BW of the quantization noise stop band is also twice of that in the first example. As a result, in the second example, the sampling rate is also twice of that in the first example.

Figure 17:
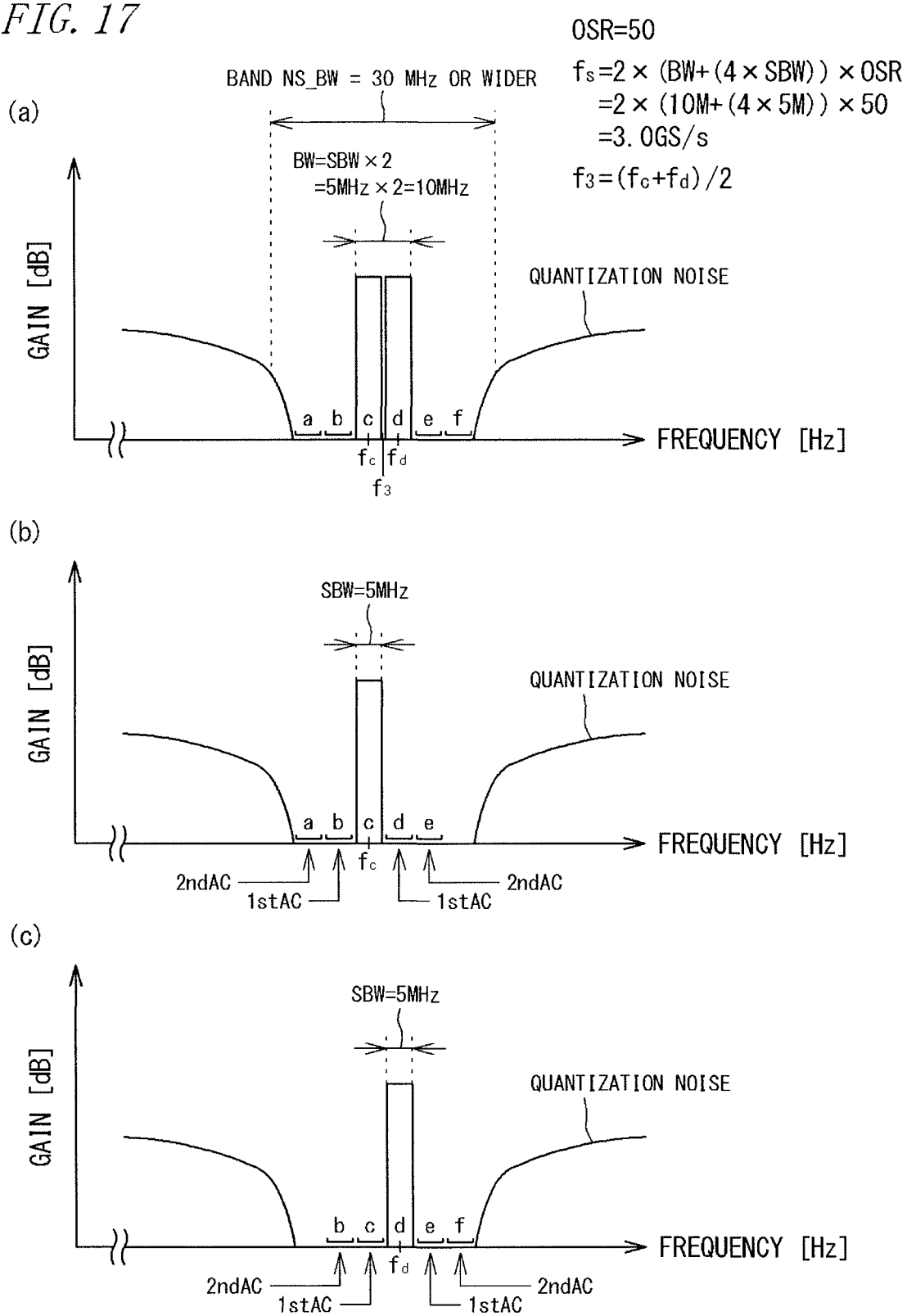
FIG. 17A is an output spectrum of a band pass delta-sigma modulator showing a third example of a quantization noise stop band.
FIG. 17B is an output spectrum when only a band c is regarded as a use band.
FIG. 17C is an output spectrum when only a band d is regarded as a use band.

In contrast to this, in the case of the third example shown in FIG. 17, although the bandwidth BW of the RF signal is twice of that in the first example as in the case of the second example, the bandwidth NS_BW of the quantization noise stop band in the third example is less than twice of that in the first example. Therefore, in the third example, it is also sufficient that the sampling rate is less than twice of that in the first example, and thus, increase of the sampling rate is suppressed.

FIG. 17B shows the communication band c shown in FIG. 17A regarded as a use band, and FIG. 17C shows the communication band d shown in FIG. 17A regarded as a use band.

As shown in FIG. 17B, when the communication band c (bandwidth SBW=5 MHz) is regarded as the use band of the RF signal, the bandwidth necessary to include all of the RF signal, and the adjacent channels (1st ACs) and the next adjacent channels (2nd ACs) is SBW×5=5 MHz×5=25 MHz (the range from a to e in FIG. 17B).

Further, as shown in FIG. 17C, also when the communication band d (bandwidth SBW=5 MHz) is regarded as the use band of the RF signal, the bandwidth necessary to include all of the RF signal, and the adjacent channels (1st ACs) and the next adjacent channels (2nd ACs) is SBW×5=5 MHz×5=25 MHz (the range from b to f in FIG. 17C).

Since the communication band c and the communication band d are different carriers from each other, as the range in which the magnitude of leakage power is regulated, the range from a to e shown in FIG. 17B and the range from b to f shown in FIG. 17C are sufficient.

Therefore, when two communication bands c and d are combined to realize the use band of the RF signal, as the range in which the magnitude of leakage power is regulated, the range from a to f shown in FIG. 17A is sufficient.

That is, if a band twice of the communication band (bandwidth SBW=5 MHz) is secured on each of both sides of the use band (bandwidth BW=10 MHz) of the RF signal, a quantization noise stop band can be obtained that includes, when two communication bands c and d are regarded as use bands, respectively, all of the adjacent channels (1st ACs) and the next adjacent channels (2nd ACs) on both sides of each of the use bands c and d.

As a result, if the bandwidth of the quantization noise stop band is NS_BW=BW+(4×SBW)=10 MHz+(4×5 MHz)=30 MHz or wider, the bandwidth corresponding to the adjacent channels and the next adjacent channels where leakage power is a problem can be secured.

Therefore, in the third example, the bandwidth NS_BW of the quantization noise stop band can be not narrower than (BW+(4×SBW)) and narrower than (BW×5).

More preferably, the bandwidth NS_BW of the quantization noise stop band can be not narrower than (BW+(4×SBW)) and not wider than (BW+(6×SBW)).

This means that, as the bandwidth NS_BW of the quantization noise stop band, a bandwidth (BW+(6×SBW)) or narrower is set in which, when the range from a to f is assumed as a basic band, an additional band having a bandwidth corresponding to one communication band (bandwidth SBW=5 MHz) is secured on each of both sides of the basic band. Accordingly, it is possible to assuredly include, when two communication bands c and d are regarded as use bands, respectively, all of the adjacent channels (1st ACs) and the next adjacent channels (2nd ACs) on both sides of each of the use bands c and d, and at the same time, it is possible to suppress the sampling rate at a low level.

For example, when the sampling frequency (sampling rate) fs is determined based on the bandwidth NS_BW=BW+(4×SBW)=30 MHz, fs=2×(BW+(4×SBW))×OSR=2×(10 MHz+(4×5 MHz))×50=3.0 GS/s.

When the sampling frequency (sampling rate) fs is determined based on the bandwidth NS_BW=BW+(6×SBW)=40 MHz, fs=2×(BW+(6×SBW))×OSR=2×(10 MHz+(6×5 MHz))×50=4.0 GS/s.

In each case, the sampling rate is reduced compared with that in the second example.

[2.4.4 Fourth Example]

In the third example, two (a plurality of) communication bands c and d forming the use band of the RF signal are adjacent to each other. However, as in the fourth example shown in FIG. 18, two (a plurality of) communication bands b and d forming the use band of the RF signal may be distanced from each other.

In the case of the fourth example, by regarding the use band as the range (SB'=15 MHz) from the communication band b to the communication band d, the band NS_BW of the quantization noise stop band can be determined in the same manner as in the third example.

That is, also in the fourth example, the bandwidth NS_BW of the quantization noise stop band can be not narrower than (BW'+(4×SBW))=35 MHz and narrower than (BW'×5)=75 MHz.

Also in the fourth example, more preferably, the bandwidth NS_BW of the quantization noise stop band can be not narrower than (BW'+(4×SBW)) and not wider than (BW'+(6×SBW)).

Figure 18:
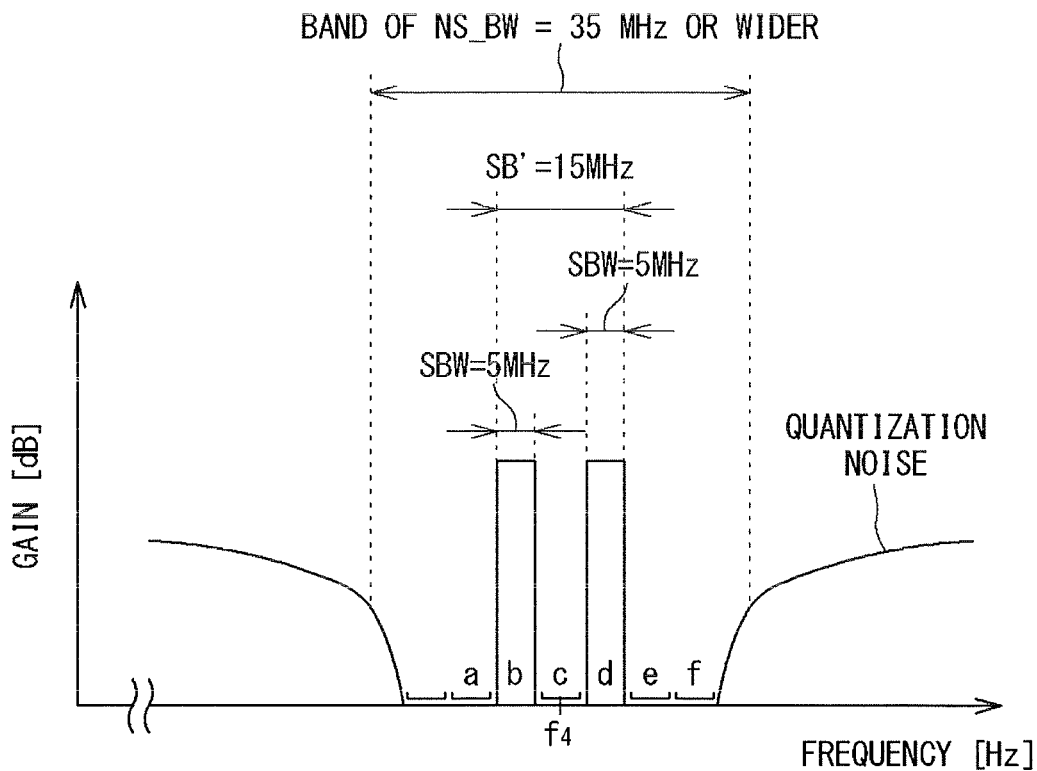
FIG. 18 is an output spectrum of a band pass delta-sigma modulator showing a fourth example of a quantization noise stop band.

In FIG. 17 and FIG. 18, when the frequency range in which the magnitude of leakage power is regulated by legal regulations or communications standards which require compliance by the radio transceiver 501 emitting the RF signal includes only the adjacent channels (first adjacent channels: 1st ACs), the bandwidth NS_BW of the quantization noise stop band can be not narrower than ((BW(BW')+(2×SBW)) and narrower than (BW(BW')×3). In this case, more preferably, the bandwidth NS_BW of the quantization noise stop band is not narrower than ((BW(BW')+(2×SBW)) and not wider than ((BW(BW')+(4×SBW)).

[2.4.5 Fifth Example]

Figure 19:
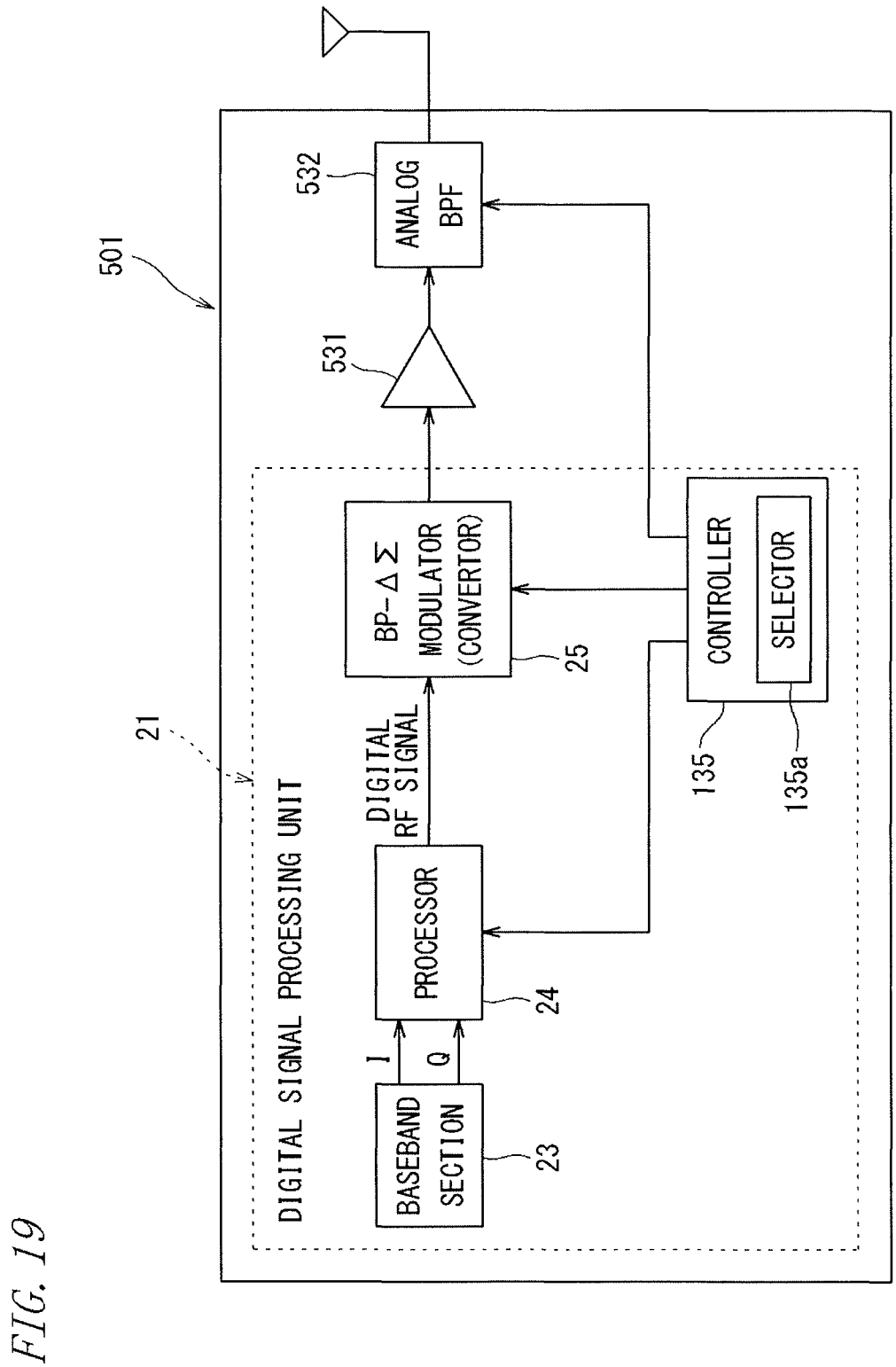
FIG. 19 is a configuration diagram of a radio transceiver for a fifth example.
Figure 20:
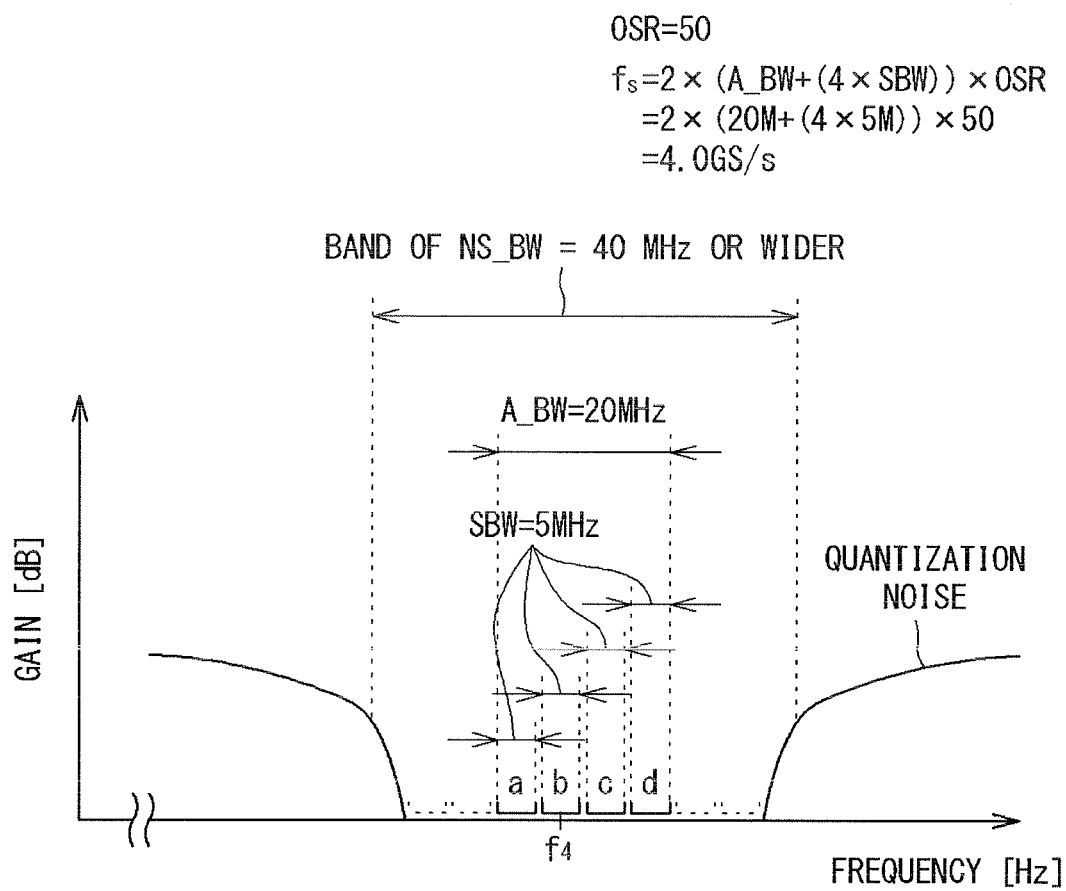
FIG. 20 is an output spectrum of a band pass delta-sigma modulator showing the fifth example of a quantization noise stop band.

FIG. 19 to FIG. 21 show a fifth example of how to set the quantization noise stop band. FIG. 19 shows the radio transceiver 501 used in the fifth example. The radio transceiver 501 shown in FIG. 19 is adjusted to multi carrier communication, and can dynamically change the frequency (communication bands a to d) to be used in communication. For changing the communication band, the digital signal processing unit 21 includes a controller 135 which includes a selector 135a which selects a communication band. The selector 135a selects, from among communication bands a to d that can be used in communication, one or a plurality of communication bands to be used in the communication.

The controller 135 controls the processor 24 based on the communication band selected by the selector 135a, thereby being able to change the use band of the RF signal outputted from the processor 24.

Further, the delta-sigma modulator 25 can convert the value of z based on formula (3) described above. That is, the delta-sigma modulator 25 can change the center frequency of the quantization noise stop band. In other words, the quantization noise stop band can be changed.

The controller 135 converts z of the delta-sigma modulator 25 based on formula (3) described above, in accordance with the center frequency $f_0$ (for example, frequencies fa, fb, fc, fd, or the like shown in FIG. 21) of the signal inputted to the delta-sigma modulator 25, thereby allowing band pass delta-sigma modulation to be performed for the desired frequency signal.

Thus, by changing cos $\theta_0$ (coefficient a) in conversion formula (3) above in accordance with the center frequency (carrier frequency) $f_0$ of the RF signal, band pass delta-sigma modulation corresponding to the desired frequency $f_0$ can be performed without changing the sampling frequency fs. If cos $\theta_0$ is changed, the coefficient of the NTF shown in formula (1) is changed, but the order of the formula is maintained. Thus, even if the configuration of the band pass delta-sigma modulator 25 is changed in accordance with the carrier frequency $f_0$ of the RF signal, the complexity (order) of the formula is not changed, and thus, signal processing load in the band pass delta-sigma modulator 25 is not changed, either.

As described above, in the present embodiment, advantageously, even if the carrier frequency $f_0$ is changed, signal processing load in the band pass delta-sigma modulator 25 is not changed. In the present embodiment, signal processing load in the band pass delta-sigma modulator 25 is dependent on the sampling frequency fs determined based on the signal bandwidth, in accordance with the Nyquist's theorem. However, even if the carrier frequency $f_0$ is changed, the signal bandwidth is not changed, and thus, the sampling frequency fs need not be changed. Note that, when the delta-sigma modulator is a low pass type, in order to cope with a change of the carrier frequency $f_0$, the sampling frequency fs needs to be changed. In this point, a band pass type is advantageous.

Further, the controller 135 can control the processor 24 so as to change the frequency of the RF signal outputted from the processor 24 to a desired frequency, to provide the resultant RF signal to the delta-sigma modulator 25.

Further, the controller 135 can also perform control such that the pass band of the analog filter 532 is changed in accordance with the communication band selected by the selector 135a.

In the case of the radio transceiver 501 configured as shown in FIG. 19, the bandwidth BW of the use band of the RF signal is dynamically changed. However, if it is configured such that the bandwidth of the quantization noise stop band of the delta-sigma modulator 25 is changed in accordance with the bandwidth BW of the RF signal which is dynamically changed, the circuit scale of the delta-sigma modulator 25 is increased.

Therefore, in the fifth example, the entirety of four communication bands a to d (bandwidth SBW is 5 MHz each) that can be used in communication is regarded as a use band (bandwidth A_BW=20 MHz), and then, the quantization noise stop band NS_BW is determined in the same manner as in the third example and the fourth example.

As shown in FIG. 20, when the bandwidth A_BW=20 MHz is regarded as the use band, if the bandwidth of the quantization noise stop band is NS_BW=A_BW+(4×SBW)=20 MHz+(4×5 MHz)=40 MHz or wider, the bandwidth corresponding to the adjacent channels and the next adjacent channels where leakage power is a problem can be secured.

Also in the fifth example, in order to suppress the sampling rate at a low level as in the third example, the bandwidth NS_BW of the quantization noise stop band can be not narrower than (A_BW+(4×SBW)) and narrower than (A_BW×5).

More preferably, the bandwidth NS_BW of the quantization noise stop band can be not narrower than (A_BW+(4×SBW)) and not wider than (A_BW+(6×SBW)).

As shown in FIG. 21, actually, there are cases where only the bands c and d among the four communication bands a to d that can be used in communication are selected as the use band. However, as shown in FIG. 20, by setting the bandwidth NS_BW of the quantization noise stop band to be (A_BW+(4×SBW)) or wider, no matter which communication bands are selected from the four communication bands a to d, the bandwidth corresponding to the adjacent channels and the next adjacent channels where leakage power is a problem can be secured.

Also in the fifth example, when the frequency range in which the magnitude of leakage power is regulated by legal regulations or communications standards which require compliance by the radio transceiver 501 emitting the RF signal includes only the adjacent channels (first adjacent channels: 1st ACs), the bandwidth NS_BW of the quantization noise stop band can be not narrower than ((A_BW+(2×SBW)) and narrower than (A_BW×3). In this case, more preferably, the bandwidth NS_BW of the quantization noise stop band is not narrower than ((A_BW+(2×SBW)) and not wider than ((A_BW+(4×SBW)).

[3. Additional Notes]

Note that the embodiment disclosed herein is merely illustrative in all aspects and should not be recognized as being restrictive. The scope of the present invention is defined by the scope of the claims rather than by the meaning described above, and is intended to include meaning equivalent to the scope of the claims and all modifications within the scope.

REFERENCE SIGNS LIST

[Chapter 1]
25 band pass delta-sigma modulator
27 loop filter
28 quantizer
125 low pass delta-sigma modulator
127 loop filter
128 quantizer
[Chapter 2]
501 radio transceiver
21 digital signal processing unit (digital signal processing device)
25 band pass delta-sigma modulator
532 band pass filter
135 controller
135a selector

The invention claimed is:

1. A method for designing a band pass delta-sigma modulator, the method comprising:
obtaining a band pass delta-sigma modulator (excluding $\theta_0=\pm(\pi/2)\times n$; n is an integer being 1 or greater), by replacing z in a z domain model of a low pass delta-sigma modulator with z' below:

$$z'=f_{cnv}(z,\theta_0), \text{wherein}$$

$f_{cnv}(z, \theta_0)$ is a function in which an absolute value of $f_{cnv}(z, \theta_0)$ is always 1 for any z and $\theta_0$, $$\theta_0=2\pi\times(f_0/fs),$$

fs is a sampling frequency, and
$f_0$ is a center frequency of a quantization noise stop band of the band pass delta-sigma modulator,
wherein
$f_{cnv}(z, \theta_0)$ is a formula on one side in an identity in which a value of the other side is 1 or −1, the identity being obtained by changing the formula below:

$$(z-e^{j\theta_0})(z-e^{-j\theta_0})=0. \qquad [\text{Math. 1}]$$

2. The method for designing the band pass delta-sigma modulator according to claim 1, wherein
z' is expressed by the formula below:

$$z' = z\frac{z-\cos\theta_0}{(\cos\theta_0)z-1}. \qquad [\text{Math. 2}]$$

3. The method for designing the band pass delta-sigma modulator according to claim 1, wherein
z' is expressed by the formula below:

$$z' = -z\frac{z-\cos\theta_0}{(\cos\theta_0)z-1}. \qquad [\text{Math. 3}]$$

4. The method for designing the band pass delta-sigma modulator according to claim 1, wherein
z' is expressed by the formula below:

$$z' = \frac{(\cos\theta_0)z-1}{z(z-\cos\theta_0)}. \qquad [\text{Math. 4}]$$

5. The method for designing the band pass delta-sigma modulator according to claim 1, wherein
z' is expressed by the formula below:

$$z' = -\frac{(\cos\theta_0)z-1}{z(z-\cos\theta_0)}. \qquad [\text{Math. 5}]$$

6. A band pass delta-sigma modulator (excluding $\theta_0=\pm(\pi/2)\times n$; n is an integer being 1 or greater) obtained by replacing z in a z domain model of a low pass delta-sigma modulator with z' below:

$$z'=f_{cnv}(z,\theta_0), \text{wherein}$$

$f_{cnv}(z, \theta_0)$ is a function in which an absolute value of $f_{cnv}(z, \theta_0)$ is always 1 for any z and $\theta_0$, $$\theta_0=2\pi\times(f_0/fs),$$

fs is a sampling frequency, and
$f_0$ is a center frequency of a quantization noise stop band of the band pass delta-sigma modulator, wherein
$f_{cnv}(z, \theta_0)$ is a formula on one side in an identity in which a value of the other side is 1 or −1, the identity being obtained by changing the formula below:

$$(z-e^{j\theta_0})(z-e^{-j\theta_0})=0. \qquad [\text{Math. 1}]$$

7. A signal processing device which performs processing on an RF signal to be transmitted as a radio wave, the signal processing device comprising:
a band pass delta-sigma modulator which performs band pass delta-sigma modulation on the RF signal, wherein
a quantization noise stop band of the band pass delta-sigma modulator includes a use band of the RF signal and has a bandwidth wider than the use band of the RF signal, wherein
the use band of the RF signal spans a plurality of communication bands, and
the quantization noise stop band has a bandwidth narrower than a minimum bandwidth including adjacent channels and next adjacent channels on both sides of the use band of the RF signal, and wherein
the quantization noise stop band has a bandwidth including, when the plurality of communication bands are regarded as use bands, respectively, all of adjacent channels on both sides of each use band.

8. The signal processing device according to claim 7, wherein
the quantization noise stop band has a bandwidth including, when the plurality of communication bands are regarded as use bands, respectively, all of the adjacent channels and next adjacent channels on both sides of each use band.

9. The signal processing device according to claim 8, wherein
the quantization noise stop band has a bandwidth not wider than a bandwidth in which, when the plurality of communication bands are regarded as use bands, respectively, an additional band having a bandwidth corresponding to one communication band is secured at each of both sides of a minimum basic band including all of the adjacent channels and the next adjacent channels on both sides of each use band.

10. A radio transceiver comprising the signal processing device according to claim 7 for processing to be performed on the RF signal.

11. The radio transceiver according to claim 10, wherein the quantization noise stop band in the signal processing device has a bandwidth not narrower than a bandwidth in which a magnitude of leakage power is regulated by legal regulations or standards which require compliance by the radio transceiver.

12. The signal processing device which performs processing on an RF signal to be transmitted as a radio wave, the signal processing device comprising:
 a band pass delta-sigma modulator which performs band pass delta-sigma modulation on the RF signal, wherein
 a quantization noise stop band of the band pass delta-sigma modulator includes a use band of the RF signal and has a bandwidth wider than the use band of the RF signal, the signal processing device further comprising:
 a band selector which selects, from among a plurality of communication bands, one or a plurality of use band of the RF signal, wherein
 the quantization noise stop band has a bandwidth narrower than a minimum band including, when an entirety of the plurality of communication bands is regarded as a use band, adjacent channels and next adjacent channels on both sides of the use band, the quantization noise stop band further having a bandwidth including, when the plurality of communication bands are regarded as use bands, respectively, all of adjacent channels and next adjacent channels on both sides of each use band.

13. A radio transceiver comprising a band pass delta-sigma modulator which performs band pass delta-sigma modulation on an RF signal to be transmitted as a radio wave to output a digital signal representing the RF signal, wherein
 a quantization noise stop band of the band pass delta-sigma modulator has a bandwidth not narrower than a bandwidth in which a magnitude of leakage power leaked outside a band of an RF signal to be transmitted as a radio wave is regulated by legal regulations or standards which require compliance by the radio transceiver.

14. The radio transceiver according to claim 13, wherein
 the bandwidth in which the magnitude of leakage power is regulated by legal regulations or communications standards which require compliance by the radio transceiver is a bandwidth corresponding to adjacent channels and next adjacent channels outside the RF signal band,
 the quantization noise stop band of the band pass delta-sigma modulator has a bandwidth which is seven times or less than seven times that of the RF signal.

15. The radio transceiver according to claim 13, wherein
 the bandwidth in which the magnitude of leakage power is regulated by legal regulations or communications standards which require compliance by the radio transceiver is a bandwidth corresponding to adjacent channels and next adjacent channels outside the RF signal band,
 the quantization noise stop band of the band pass delta-sigma modulator has a bandwidth which is five times or less than five times that of the RF signal.

* * * * *